(12) United States Patent
Aota

(10) Patent No.: US 9,740,067 B2
(45) Date of Patent: Aug. 22, 2017

(54) DISPLAY DEVICE AND METHOD FOR PRODUCING SAME

(71) Applicant: Sharp Kabushiki Kaisha, Osaka (JP)

(72) Inventor: Keiji Aota, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 20 days.

(21) Appl. No.: 14/424,369

(22) PCT Filed: Aug. 27, 2013

(86) PCT No.: PCT/JP2013/005059
§ 371 (c)(1),
(2) Date: Feb. 26, 2015

(87) PCT Pub. No.: WO2014/034102
PCT Pub. Date: Mar. 6, 2014

(65) Prior Publication Data
US 2015/0226995 A1   Aug. 13, 2015

(30) Foreign Application Priority Data

Sep. 3, 2012   (JP) ................................. 2012-192793

(51) Int. Cl.
*G02F 1/1345* (2006.01)
*H01L 23/498* (2006.01)
(Continued)

(52) U.S. Cl.
CPC ............ *G02F 1/13452* (2013.01); *C09J 9/02* (2013.01); *H01L 21/50* (2013.01);
(Continued)

(58) Field of Classification Search
CPC ............... H01L 21/50; H01L 23/49816; H01L 23/49838; H01L 24/29; H01L 24/32; H01L 24/83; H01L 24/91; H01L 24/16; H01L 24/81; H01L 24/14; H01L 2021/603; H01L 2021/60022; H01L 2021/60277;
(Continued)

(56) References Cited

U.S. PATENT DOCUMENTS

2004/0028893 A1\* 2/2004 Inoue ................. G01R 1/06755
428/328

FOREIGN PATENT DOCUMENTS

JP   2002-246404 A   8/2002

OTHER PUBLICATIONS

English language translation of Japanese patent publication No. 2002246404. Translation downloaded from https://patents.google.com on Aug. 16, 2016; translation provided by the Google translate feature available on the website.\*

\* cited by examiner

*Primary Examiner* — Angela Davison
(74) *Attorney, Agent, or Firm* — Chen Yoshimura LLP

(57) ABSTRACT

In a display device, in which an IC chip, which has an output and an input bump group, is mounted onto a display panel via an ACF, and a total area of end surfaces of output bumps that form the output bump group is larger than a total area of end surfaces of input bumps that form the input bump group, a concentration of conductive particles in a portion of the ACF corresponding to the output bump group is lower than a concentration of conductive particles in a portion of the ACF corresponding to the input bump group.

6 Claims, 13 Drawing Sheets

(51) Int. Cl.
*H01L 23/00* (2006.01)
*C09J 9/02* (2006.01)
*H01L 21/50* (2006.01)
*H01L 21/603* (2006.01)

(52) U.S. Cl.
CPC .. *H01L 23/49816* (2013.01); *H01L 23/49838* (2013.01); *H01L 24/29* (2013.01); *H01L 24/32* (2013.01); *H01L 24/83* (2013.01); *H01L 24/91* (2013.01); *H01L 24/16* (2013.01); *H01L 24/81* (2013.01); *H01L 2021/603* (2013.01); *H01L 2224/13013* (2013.01); *H01L 2224/1403* (2013.01); *H01L 2224/271* (2013.01); *H01L 2224/27003* (2013.01); *H01L 2224/293* (2013.01); *H01L 2224/2919* (2013.01); *H01L 2224/2929* (2013.01); *H01L 2224/29078* (2013.01); *H01L 2224/29082* (2013.01); *H01L 2224/29499* (2013.01); *H01L 2224/81913* (2013.01); *H01L 2224/83851* (2013.01); *H01L 2224/83912* (2013.01); *H01L 2224/9211* (2013.01); *H01L 2924/12042* (2013.01)

(58) Field of Classification Search
CPC ... H01L 2224/13013; H01L 2224/1403; H01L 2224/27003; H01L 2224/271; H01L 2224/29078; H01L 2224/29082; H01L 2224/2919; H01L 2224/2929; H01L 2224/293; H01L 2224/29499; H01L 2224/81913; H01L 2224/83851; H01L 2224/9211; H01L 2224/73204; H01L 2924/12042; C09J 9/02; G02F 1/13452
USPC .......................... 349/149, 151, 152, 51, 52
See application file for complete search history.

FIG. 8
(a)
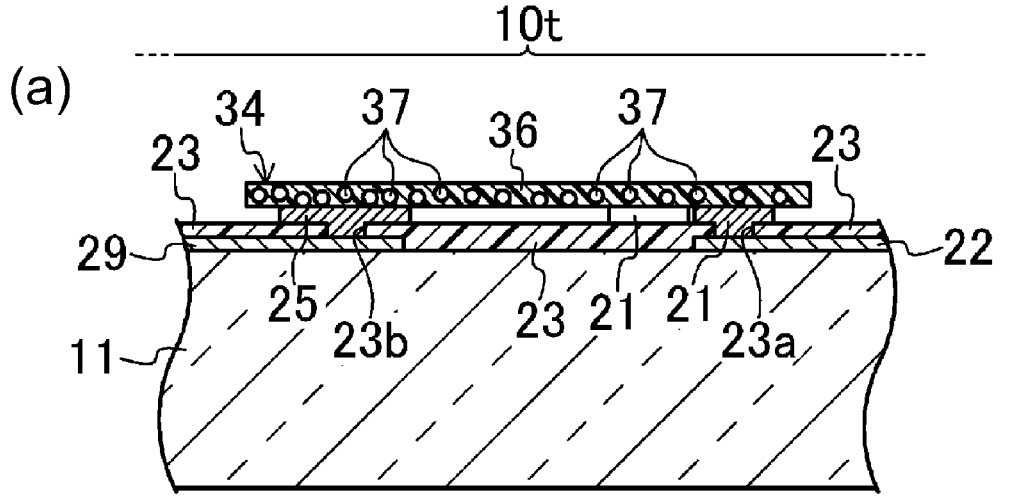
(b)
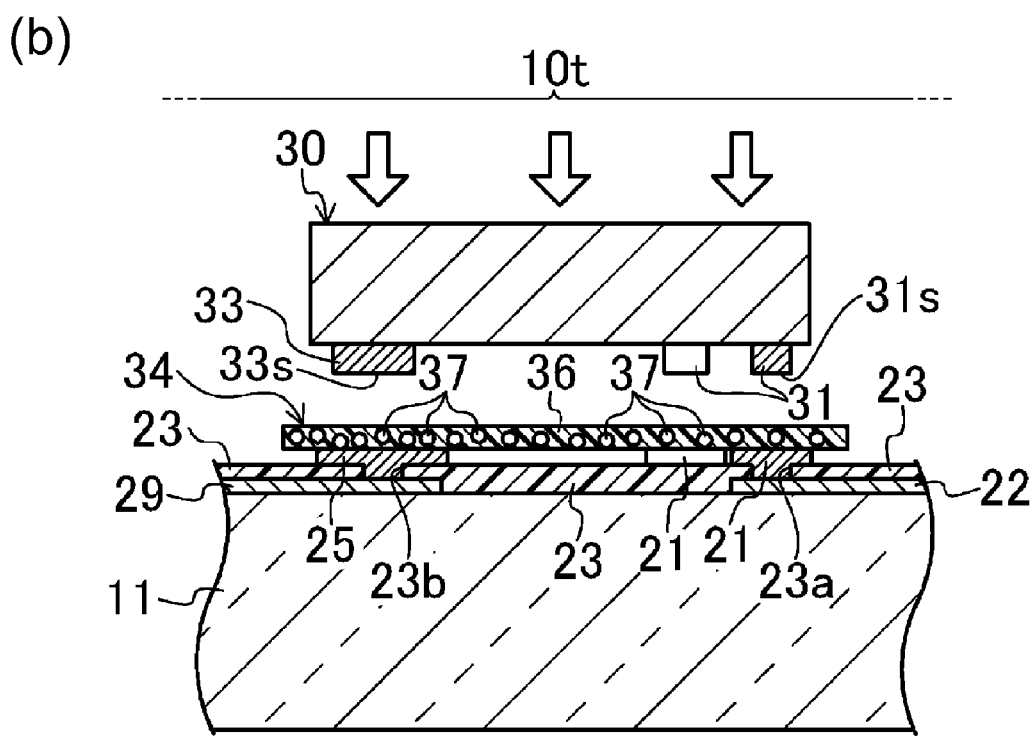

FIG. 9
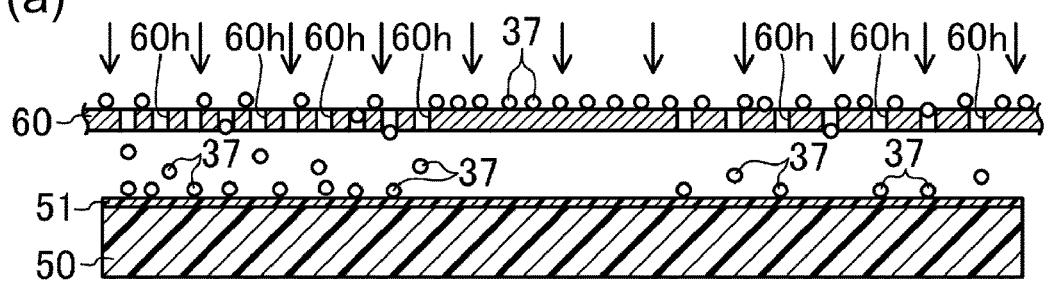
(a)
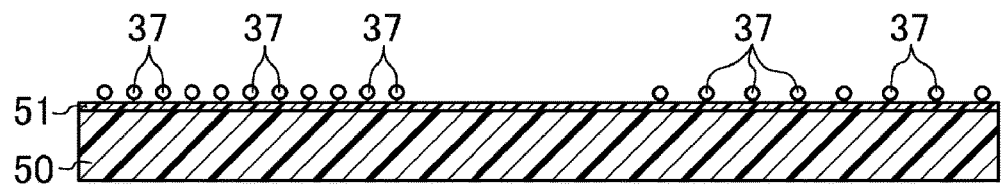
(b)
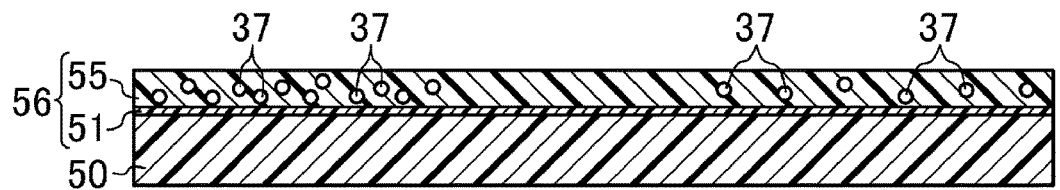
(c)

FIG. 10
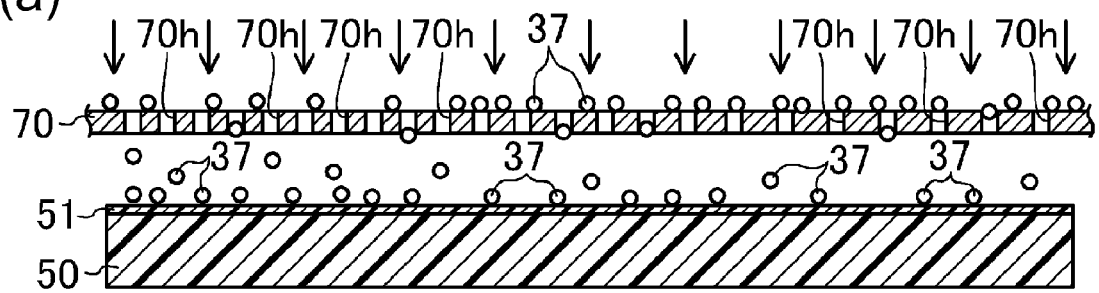
(a)
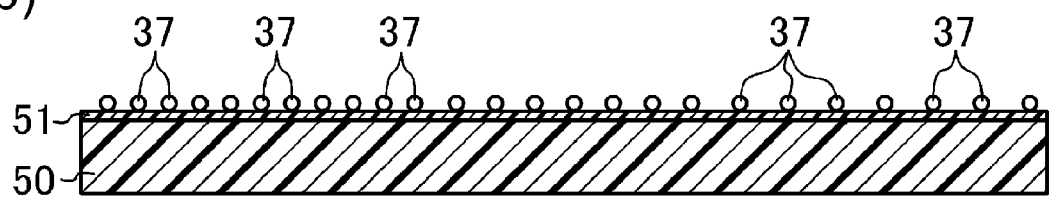
(b)
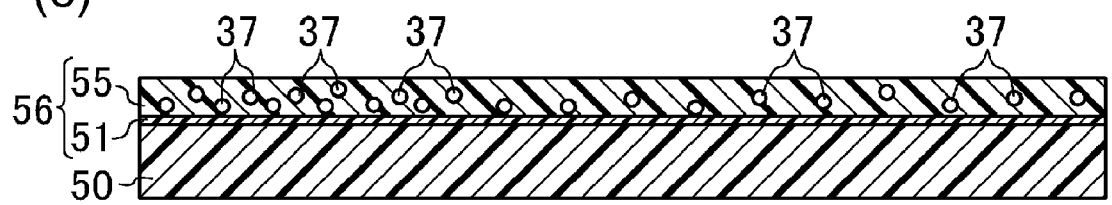
(c)

FIG. 12
(a)
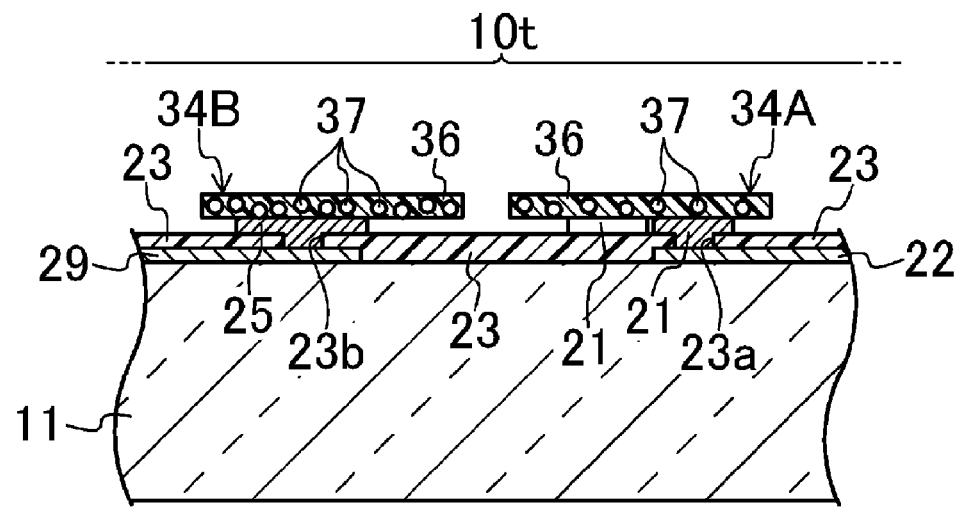
(b)
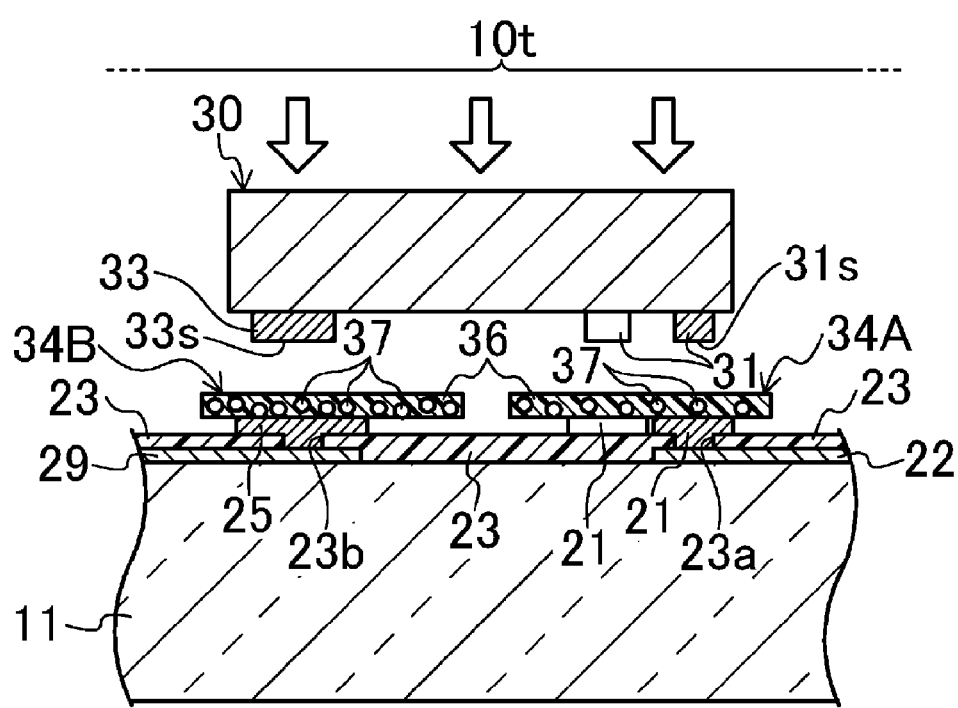

DISPLAY DEVICE AND METHOD FOR PRODUCING SAME

TECHNICAL FIELD

The present invention relates to a display device, such as a liquid crystal display device having a so-called chip on glass (COG) mounting structure, in which an integrated circuit (IC) chip is mounted directly to the surface of a substrate forming a portion of a display panel, and more particularly, to measures for countering poor IC chip connections to the display panel.

BACKGROUND ART

A liquid crystal display device with a COG mounting structure has a structure in which an IC chip, which functions as a driver, is directly mounted to a substrate surface located at a peripheral section of the liquid crystal display device. IC chip mounting techniques are broadly divided into face-down bonding techniques and face-up bonding techniques. The former enables a mounting area to be made smaller than that of the latter, and in addition, the wiring for mounting in the former technique is shorter than in the latter technique, making a face-down bonding technique suitable for use in a display device for which high-speed communications, excellent noise characteristics, compact size, a thin profile, and increased speed are demanded.

An IC chip mounted using a face-down bonding technique is mounted by placing the surface side having a connection surface so as to face downward and bonding by thermocompression. Therefore, a projection connection terminal called a bump is disposed on the bottom surface side of the IC chip. Specifically, the IC chip is formed into a rectangular shape in plan view, for example, and an input bump group in which a plurality of input bumps is aggregated on the bottom surface of one of the longer sides, and an output bump group in which a plurality of output bumps is aggregated on the bottom surface of the other of the longer side are respectively arranged on the IC chip.

As a method of mounting an IC chip in this manner onto the surface of a liquid crystal display panel substrate, it is preferable that an anisotropic conductive film (ACF) connection technique by which the IC chip is connected to the substrate surface via an ACF containing a large number of conductive particles in an adhesive having insulating properties be used because this technique enables the realization of high-density mounting. In the ACF connection technique, a bump on the IC chip and a connection terminal disposed at a location on the liquid crystal panel where the IC chip is to be mounted are electrically connected by interposing the conductive particles inside the ACF therebetween and compressing these particles flat.

To reliably establish a conduction state between an IC chip bump and a connection terminal of the liquid crystal display panel, when bonding the IC chip by pressure, it is preferable that the pressure applied to the conductive particles interposed between the IC chip bump and the liquid crystal display panel connection terminal be uniform for all sets of corresponding bumps and connection terminals, and that the flatness state of the conductive particles be made uniform at all bump connection locations; but in reality, this is not the case.

That is, it is normal for the total areas of the connection surfaces formed by end surfaces of the bumps in the input bump group and output bump group to differ, and therefore the amount of conductive particles trapped between the input bump group and the output bump group, and the connection terminals of the liquid crystal display panel at IC chip pressure bonding time differs in proportion to the difference in the total areas. As a result of this, the pressure applied to the trapped conductive particles at the input bump connection locations and the output bump connection locations changes, and the flatness state of the conductive particles ceases to be uniform at these input bump and output bump connection locations.

When this happens, the conductive particles, for which the pressure applied at IC chip pressure bonding time is relatively low, have a lower degree of deformation and do not become particularly flat, thereby making it impossible to ensure an adequate connection area between a bump and a connection terminal having the conductive particles interposed therebetween, and raising the likelihood of electrical connection defects occurring. However, when the pressing force applied to the IC chip at pressure bonding time is too strong, an excessive load is placed on the conductive particles, causing the particles to undergo compositional deformation, which makes it impossible to obtain a good conduction state between the bump and the connection terminal having the conductive particles interposed therebetween.

Accordingly, configurations for making the flatness state of the conductive particles at all bump connection locations as uniform as possible have been proposed for some time. Patent Document 1 discloses a configuration in which the relationship between the total area S of the connection surfaces (mounting surfaces) of the input bumps, the total area T1 of the connection surfaces of a row of output bumps located on the inner side of the chip, and the total area T2 of the connection surfaces of a row of output bumps located on the outer side of the chip was set to S≥T1>T2 and S≥T1+T2 in an IC chip in which a plurality of output bump arrangements was disposed in a so-called zigzag configuration, for example.

RELATED ART DOCUMENT

Patent Document

Patent Document 1: Japanese Patent Application Laid-Open Publication No. 2002-246404 (paragraphs [0016] to [0027], and FIG. 1)

SUMMARY OF THE INVENTION

Problems to be Solved by the Invention

Enhanced multi-output is being required in IC chips in line with the higher resolution and higher performance of liquid crystal display devices in recent years. A higher multi-output IC chip is generally realized by making the pitch of the output bumps finer (miniaturization), and therefore, when enhancing multi-output without changing the size of the chip, there is no other choice but to reduce the total area of the connection surfaces of the output bumps.

However, in the IC chip configuration disclosed in Patent Document 1, since the total areas of the connection surfaces of the output bumps are limited by the total area of the connection surfaces of the input bumps, there are limitations to making the pitch of the output bumps finer, higher IC chip multi-output is impeded, and it becomes impossible to support the move toward ultra-high-density packaging in recent years.

The present invention was made in view of such problems, and aims at ensuring a good conduction state between the IC chip and the display panel using a configuration that can support ultra-high-density packaging.

Means for Solving the Problems

To achieve the above-stated aim, the present invention is such that a concentration of conductive particles in an ACF that is used in the mounting of an IC chip is made to differ between a region corresponding to a bump group having bumps for which the total area of end surfaces that form connection surfaces for a terminal region is relatively large, and a region corresponding to a bump group having bumps for which the total area of end surfaces that form the aforementioned connection surfaces is relatively small.

Specifically, the present invention is aimed at a display device having a COG mounting structure and a method for producing same, and adopts the following solutions.

That is, a first invention is a display device that includes:

a display panel having a display region and a terminal region; and an integrated circuit chip disposed in the terminal region via an anisotropic conductive film that has a plurality of conductive particles, wherein the integrated circuit chip has a first bump group in which a plurality of first bumps are aggregated and a second bump group in which a plurality of second bumps are aggregated, wherein the first bumps of the first bump group and the second bumps of the second bump group are electrically connected to the terminal region via the conductive particles of the anisotropic conductive film, wherein a total area of end surfaces of the first bumps in the first bump group is larger than a total area of end surfaces of the second bumps in the second bump group, and wherein the concentration of conductive particles in the anisotropic conductive film corresponding to the first bump group is lower than the concentration of conductive particles in the anisotropic conductive film corresponding to the second bump group.

In the first invention, since the total area of the end surfaces that form the connection surfaces for the terminal region is larger for the first bumps forming the first bump group than for the second bumps forming the second bump group, overall more conductive particles are likely to be trapped between the terminal region and the first bump group than the second bump group when the IC chip is bonded by pressure to the terminal region, but since the concentration of conductive particles in the ACF corresponding to the first bump group is lower than the concentration of conductive particles in the ACF corresponding to the second bump group, the difference between the overall number of conductive particles trapped between the terminal region and the first bump group and the overall number of conductive particles trapped between the terminal region and the second bump group can be reduced. This makes it possible to bring the pressure applied to the trapped conductive particles closer to uniformity at first bump connection locations and second bump connection locations, and to bring the flatness state of the conductive particles closer to uniformity at these first bump and second bump connection locations.

Moreover, because the present invention does not place limits on the configuration of the IC chip bumps, the enhancement of IC chip multi-output is not impeded.

Therefore, according to the first invention, a good conduction state can be ensured between the IC chip and the display panel using a configuration capable of supporting ultra-high-density packaging.

A second invention is the display device of the first invention, wherein D1 and D2 satisfy a relational formula below:

$$D1 \times 0.7 \leq D2 \times (S2/S1) \leq D1$$

where D1 is the concentration of conductive particles in the anisotropic conductive film corresponding to the first bump group of the integrated circuit chip, D2 is the concentration of conductive particles in the anisotropic conductive film corresponding to the second bump group of the integrated circuit chip, S1 is the total area of the end surfaces of the first bumps in the first bump group, and S2 is the total area of the end surfaces of the second bumps in the second bump group.

Ideally, the D1 and D2 above are set so as to satisfy the relational formula $D2 \times (S2/S1) = D1$.

In the second invention, the percentages by content D1, D2 of conductive particles in the ACFs corresponding to the two bump groups are set in accordance with the ratio between the total area S1 of the end surfaces of the first bumps forming the first bump group and the total area S2 of the end surfaces of the second bumps forming the second bump group. This makes it possible to mount the IC chip to the display panel in a good state.

When the D1 and D2 above are set so as to satisfy the relational formula $D1 \times 0.7 > D2 \times (S2/S1)$, hypothetically there is a danger of the concentration of conductive particles in the ACF corresponding to the first bump group becoming too high, causing a short circuit to occur via the conductive particles between adjacent first bumps.

On the other hand, when the D1 and D2 above are set so as to satisfy the relational formula $D2 \times (S2/S1) > D1$, hypothetically there is a danger of the concentration of conductive particles in the ACF corresponding to the first bump group becoming too low, and either an insufficient number of conductive particles or no conductive particles at all being trapped between the terminal region and the first bumps, making it impossible to ensure the desired conduction state between the terminal region and these first bumps.

By contrast, in the second invention, since the D1 and D2 above are set so as to satisfy the relational formula $D1 \times 0.7 \leq D2 \times (S2/S1) \leq D1$, the desired conduction state can be ensured between the terminal region and these first bumps by trapping a sufficient number of conductive particles between the terminal region and the first bumps while preventing short circuits from occurring between adjacent first bumps.

A third invention is the display device of the first or second invention, wherein the anisotropic conductive film is formed using a single sheet in which the concentration of the conductive particles differs in a region corresponding to the first bump group of the integrated circuit chip and in a region corresponding to the second bump group of the integrated circuit chip.

In the third invention, the ACF corresponding to the first bump group and the second bump group is a common sheet. When manufacturing a display device with a configuration such as this, since only one common ACF is attached at the locations where the first bump group and second bump group are arranged in the IC chip mounting step, there is no increase in the number of steps required to mount an IC chip compared to when separate ACFs are respectively attached at the locations where the first bump group and second bump group are arranged. This makes it possible to mount an IC chip to the display panel using the same number of steps as in the past.

A fourth invention is the display device of the first or second invention, wherein the anisotropic conductive film is formed using separate sheets in which the concentration of the conductive particles differs in a region corresponding to the first bump group of the integrated circuit chip and in a region corresponding to the second bump group of the integrated circuit chip.

In the fourth invention, the ACFs corresponding to the first bump group and the second bump group are separate sheets. In a display device with a configuration like this, an ordinary sheet in which the distribution of the conductive particles is uniform can be used as the ACF, thereby making it possible to manufacture the display device at lower cost since there is no need for an expensive ACF having a special configuration for making the concentration of conductive particles differ in a partial manner.

The display device of the fourth invention does not increase the number of steps required to mount an IC chip either when the two ACFs are attached simultaneously at the locations in the terminal region of the display panel where the first bump group and second bump group are to be arranged, making it possible to enhance display device production efficiency.

A fifth invention is the display device of any one of the first to fourth inventions, wherein the first bumps of the integrated circuit chip are output bumps and are arranged in a plurality of rows in a zigzag manner, and wherein the second bumps of the integrated circuit chip are input bumps.

According to the fifth invention, enhanced IC chip multi-output is realized by the output bumps being arranged in a plurality of rows in a zigzag manner. This makes it possible to realize a display device having higher resolution and higher functionality without such IC chip-based limitations as finer pitches and/or connection defects.

A sixth invention is the display device of any one of the first to fifth inventions, wherein an area of the end surface of each of the first bumps of the integrated circuit chip is smaller than an area of the end surface of each of the second bumps of the integrated circuit chip.

According to the sixth invention, the effects of the present invention are also achieved in a concrete manner.

A seventh invention is the display device of any one of the first to the sixth inventions, wherein the display panel is a liquid crystal display panel.

According to the seventh invention, the effects of the present invention can be effectively obtained in a liquid crystal display device.

An eighth invention is a method of manufacturing a display device that includes: a display panel having a display region and a terminal region; and an integrated circuit chip disposed in the terminal region, the integrated circuit chip having a first bump group in which a plurality of first bumps are aggregated and a second bump group in which a plurality of second bumps are aggregated, the method including:

attaching a first anisotropic conductive film, in which conductive particles are uniformly distributed, to cover the terminal region of the display panel at a location where the first bump group of the integrated circuit chip is to be arranged and at a location where the second bump group of the integrated circuit chip is to be arranged;

attaching in an overlapping manner a second anisotropic conductive film, in which conductive particles are uniformly distributed, to the first anisotropic conductive film that has been attached at the location where the first bump group is to be arranged, and attaching in an overlapping manner a non-conductive film, which does not include conductive particles, to the first anisotropic conductive film that has been attached at the location where the second bump group is to be arranged; and bonding the integrated circuit chip by thermocompression to the terminal region by pressing the first bump group against a region where the first anisotropic conductive film and the second anisotropic conductive film overlap, pressing the second bump group against a region where the first anisotropic conductive film and the non-conductive film overlap, and respectively electrically connecting first bumps of the first bump group and the second bumps of the second bump group to the terminal region via the conductive particles.

In the eighth invention, a first ACF and a second ACF are attached in an overlapping manner at the location where the first bump group is to be arranged in the terminal region, the first bump group is pressed against this overlapping portion, and each of the first bumps is electrically connected to the terminal region via the conductive particles, and a first ACF and an NCF are attached in an overlapping manner at the location where the second bump group is to be arranged in the terminal region, the second bump group is pressed against this overlapping portion, and each of the second bumps is electrically connected to the terminal region via the conductive particles. In so doing, when the IC chip is mounted to the terminal region, the first bumps are connected to the terminal region via two integrated ACFs, and as such the concentration of conductive particles in the ACF corresponding to the first bump group becomes relatively high. On the other hand, the second bumps are connected to the terminal region via one ACF and an NCF, and as such the concentration of conductive particles in the ACF corresponding to the second bump group becomes relatively low as a result of the ACF being integrated with the NCF. This makes it possible to manufacture a display device according to the first invention using a simple method.

Effects of the Invention

According to the present invention, in an IC chip disposed on a display panel, the total area of the end surfaces of the first bumps forming the first bump group is larger than the total area of the end surfaces of the second bumps forming the second bump group, but because the concentration of conductive particles in the ACF corresponding to the first bump group is lower than the concentration of conductive particles in the ACF corresponding to the second bump group, a good conduction state can be ensured between the IC chip and the display panel using a configuration capable of supporting ultra-high-density packaging.

BRIEF DESCRIPTION OF THE DRAWINGS

FIGS. 8(a) and 8(b) are cross-sectional views illustrating steps for manufacturing an IC chip in a method of manufacturing the liquid crystal display device according to Embodiment 1.

FIGS. 9(a) to 9(c) are cross-sectional views illustrating steps for manufacturing an ACF according to Modification Example 1 of Embodiment 1.

FIGS. 10(a) to 10(c) are cross-sectional views illustrating steps for manufacturing an ACF according to Modification Example 2 of Embodiment 1.

FIGS. 12(a) and 12(b) are cross-sectional views illustrating steps for manufacturing an IC chip in a mounting process of a liquid crystal display device according to Embodiment 2.

DETAILED DESCRIPTION OF EMBODIMENTS

Embodiments of the present invention will be described in detail below with reference to the figures. Furthermore, the present invention is not limited to the embodiments described below.

<Embodiment 1 of the Invention>

Figure 1:
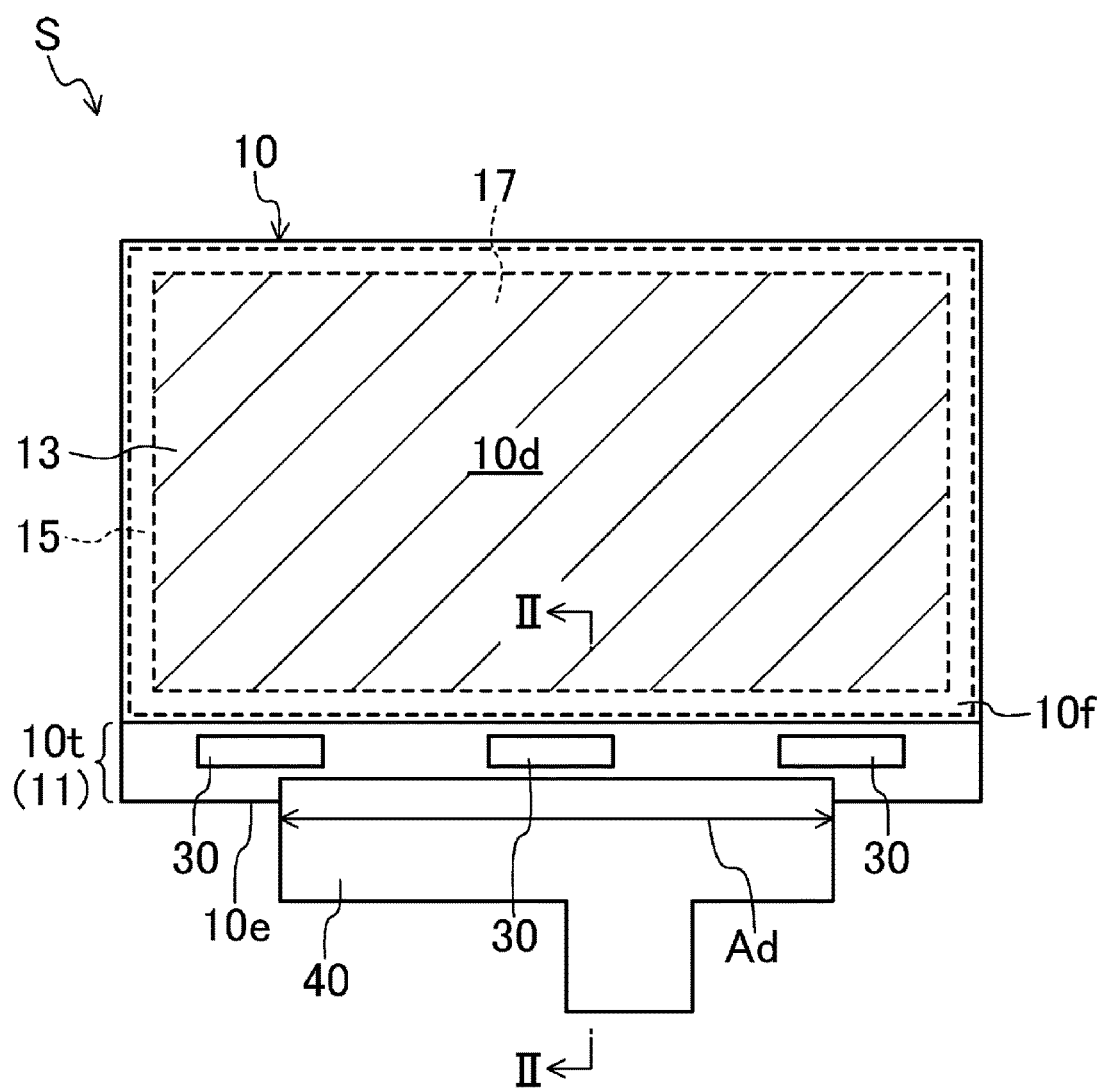
FIG. 1 is a plan view schematically illustrating a liquid crystal display device according to Embodiment 1.
Figure 2:
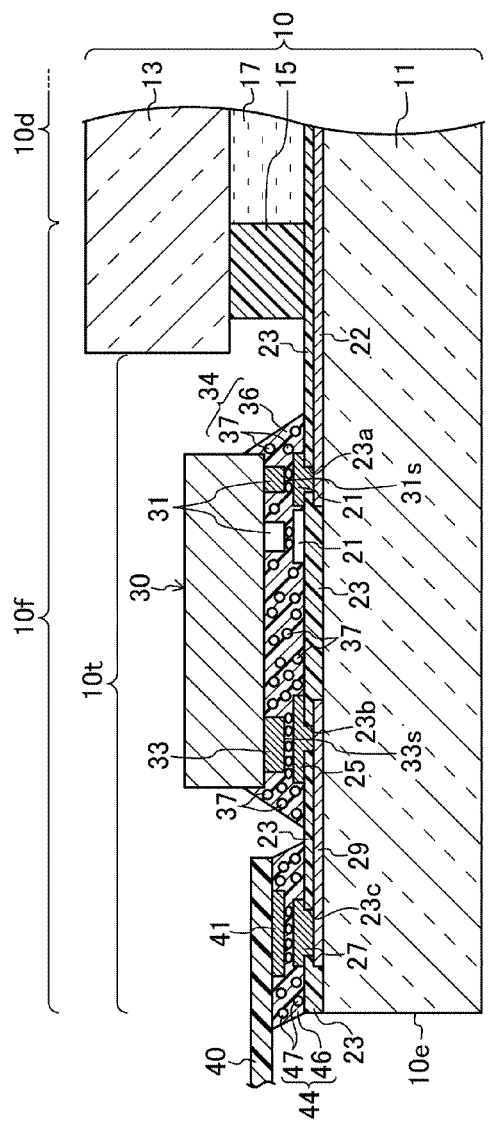
FIG. 2 is a cross-sectional view illustrating a cross-sectional structure along the line II-II in FIG. 1.

The present Embodiment 1 will be described using a liquid crystal display device S as an example of a display device according to the present invention. FIG. 1 is a plan view schematically illustrating the configuration of a liquid crystal display device S. FIG. 2 is a cross-sectional view of a cross-sectional structure along line II-II of FIG. 1. The liquid crystal display device S of the present embodiment is used as a display in television sets, personal computers and other such office automation (OA) equipment, and smart phones and the like.

—Configuration of Liquid Crystal Display Device S—

As illustrated in FIGS. 1 and 2, the liquid crystal display device S has a COG mounting structure, and is provided with a liquid crystal display panel 10, a plurality of IC chips 30 (three in the example illustrated in FIG. 1) directly mounted to the surface of a substrate 11 that forms a portion of the liquid crystal display panel 10, and a flexible printed circuit (FPC) board 40, for example, as a wiring substrate, the one end of which is connected to the surface of the substrate 11.

Additionally, when the liquid crystal display device S is either a transmissive or a transflective (also referred to as a display device that performs both a reflective and transmissive display) liquid crystal display device, a backlight unit (not shown in the drawings) is further provided on the back side of the liquid crystal display panel 10 as a planar light source device configured so as to emit a planar light to the liquid crystal display panel 10 side.

The liquid crystal display panel 10 is formed in a rectangular shape, for example, and has a structure in which an active matrix substrate 11 and an opposite substrate 13, which are disposed opposite one another, are provided. The peripheral edges of these two substrates 11, 13 are bonded using a rectangular frame shape sealing material 15, for example, and a liquid crystal layer 17 is sealed between the active matrix substrate 11 and the opposite substrate 13 in a space formed on the inner side of the sealing material 15.

The present liquid crystal display panel 10 has a rectangular display region 10d (the shaded region in FIG. 1) for displaying an image, for example, in the region where the active matrix substrate 11 and the opposite substrate 13 overlap one another, i.e., the region on the inner side of the sealing material 15, that is, the region in which a liquid crystal layer 17 was disposed. This display region 10d is configured having a plurality of pixels, which are the smallest units of an image display, arranged in a matrix shape.

The liquid crystal display panel 10 has a rectangular frame-shaped frame region 10f, which is a non-display region, for example, surrounding the display region 10d. A terminal region 10t where the active matrix substrate 11 partially protrudes out from the opposite substrate 13 and exposes a surface on the opposite substrate 13 side is disposed on one side (the lower side in FIG. 1) of the frame region 10f.

The active matrix substrate 11 is a rectangular thin film transistor (TFT) substrate, for example. The active matrix substrate 11 is formed longer in one direction (the vertical direction in FIG. 1) than the opposite substrate 13 by a portion constituting the terminal region 10t. Although not shown in the drawing, as display wiring, a large number of gate wires and sources wires are formed so as to intersect with one another through an insulating layer 23 in the display region 10d of the active matrix substrate 11. The gate wires and the source wires form an overall grid pattern, and demarcate the aforementioned pixels. A TFT and an auxiliary capacitance connected thereto, as well as a pixel electrode are disposed at each pixel demarcated by these two wires.

The opposite substrate 13 is a rectangular color filter substrate, for example. Although not shown in the drawing, a black matrix that corresponds to the aforementioned gate wires and source wires is disposed in a grid pattern in the display region 10d of the opposite substrate 13. The opposite substrate 13 is provided with a color filter that is made from filter layers of a plurality of colors, such as a red layer, a green layer, and a blue layer, for example, disposed so as to be arranged cyclically in the interstices of the black matrix, and a common electrode, which covers these color filters and is opposite a group of the aforementioned pixel electrodes.

Alignment films (not shown in the drawing) are respectively disposed on the mutually opposing inner surfaces of the active matrix substrate 11 and the opposite substrate 13. Also, polarizing plates (not shown in the drawing) having transmission axes that differ from one another by 90° are respectively disposed on the outer surfaces of these two substrates 11, 13. The sealing material 15 is formed using a well-known resin made from an epoxy resin or the like and having at least one of a heat-curable or photocurable property, for example. The liquid crystal layer 17 is made of a nematic liquid crystal material having electro-optical characteristics, for example.

The present invention will be described here using an example of a TFT-driven liquid crystal display panel 10 provided with a TFT substrate as the active matrix substrate 11, but the liquid crystal mode, pixel structure, and drive mode of the liquid crystal display panel 10 are arbitrary, and any liquid crystal display panel can be used as the display panel 10.

In the terminal region 10t of the liquid crystal display panel 10, to support higher resolution and higher performance, the aforementioned plurality of IC chips 30 is mounted closer to the display region 10d using a face-down bonding technique, and arranged in a line along an edge (end edge) 10e located at the end of the terminal region 10t in the projection direction. One end of the aforementioned FPC 40 is connected to a portion of the terminal region 10t closer to the end edge 10e side than to the IC chips 30.

In the present embodiment, a configuration in which only one FPC 40 is provided for a plurality of IC chips 30 is illustrated in FIG. 1, but the present invention is not limited to this, and a plurality of FPCs 40 may be provided such that an FPC 40 is allocated for each IC chip 30 to form one-on-one sets with individual IC chips 30.

Figure 3:
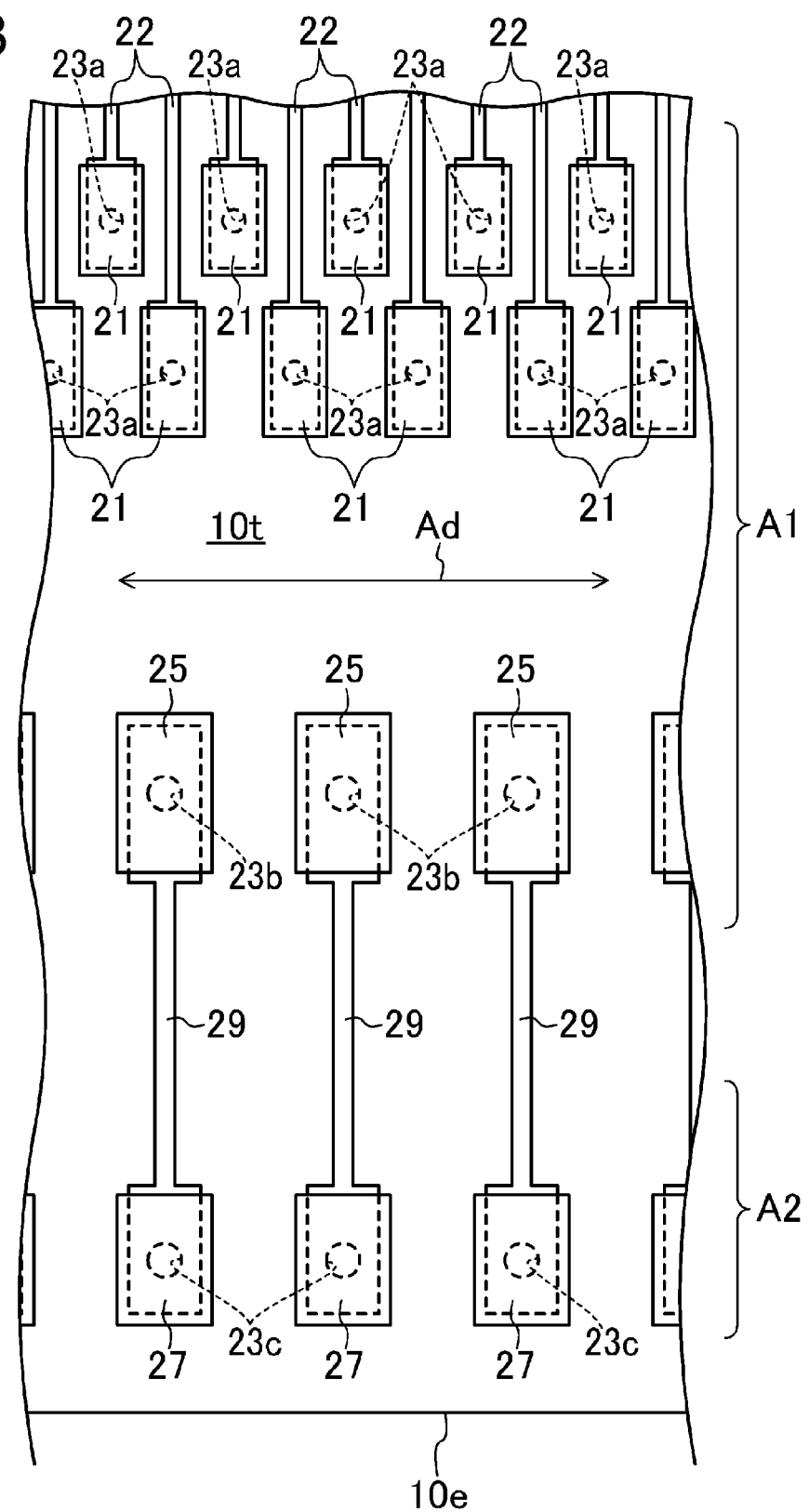
FIG. 3 is an enlarged plan view illustrating a portion of a terminal region of a liquid crystal display panel.

FIG. 3 is an enlarged plan view illustrating a portion of the configuration of the terminal region 10t of the liquid crystal display panel 10.

In the terminal region 10t, as illustrated in FIG. 3, a plurality of input connection terminals 21 for receiving output signals from an IC chip 30 is arranged in rows (two rows in the example illustrated in FIG. 3) in a zigzag manner to form a group in a portion of the display region 10d side (the upper side in FIG. 3) in an IC chip 30 connection location A1.

Specifically, the input connection terminals 21 are aligned in a direction that parallels the end edge 10e of the terminal region 10t, that is, in the direction Ad in which the IC chip 30 is arranged, and form a plurality of rows. The plurality of rows formed by the input connection terminals 21 is disposed separately from one another at a prescribed pitch (half pitch for example) deviation in the direction Ad in which the IC chip 30 is arranged, and in a direction that is orthogonal to the direction Ad in which the IC chip 30 is arranged. In the plurality of input connection terminals 21, the pitch arrangement of adjacent input connection terminals 21 is on average around 14 μm to 16 μm, for example. Furthermore, the pitch arrangement may be set even narrower as pitch narrowing advances in line with the enhancement of multi-output capabilities.

These input connection terminals 21 are connected to lead-out end portions of lead-out wires 22 leading out to the terminal region 10t from the aforementioned display wires that extend to the display region 10d. Each lead-out wire 22, as illustrated in FIG. 2, is covered by an insulating film 23, and is connected to an input connection terminal 21 disposed on the insulating film 23 via a contact hole 23a formed in the insulating film 23.

In the terminal region 10t, as illustrated in FIG. 3, a plurality of output connection terminals 25, which output input signals from the FPC 40 to the IC chip 30, is also formed so as to be aligned in the direction Ad in which the IC chip 30 is arranged on the opposite side from the display region 10d in the IC chip 30 connection location A1, that is, on the end edge 10e side (the lower side in FIG. 3) of the terminal region 10t. In the plurality of output connection terminals 25, the pitch arrangement of adjacent output connection terminals 25 is on average around 60 μm to 120 μm, for example.

In addition, in the FPC 40 connection location A2 of the terminal region 10t, a plurality of FPC connection terminals 27, which receive input signals from the FPC 40, is formed so as to be aligned parallel to the end edge 10e of the terminal region 10t. In the plurality of FPC connection terminals 27, the pitch arrangement of adjacent FPC connection terminals 27 is on average around 100 μm to 600 μm, for example.

These output connection terminals 25 and FPC connection terminals 27 are disposed so as to form one-on-one sets, and are electrically connected via lead wires 29 disposed in the terminal region 10t so as to extend in the projection direction thereof. These lead wires 29, together with the lead-out wires 22, are covered by the insulating film 23 as illustrated in FIG. 2. The end portion of each lead wire 29 on the display region 10d side (the right side end portion in FIG. 2) is connected via a contact hole 23b formed in the insulating film 23 to an output connection terminal 25 formed on the insulating film 23, and the end portion of the opposite side thereto (the left side end portion in FIG. 2) is connected via a contact hole 23c formed in the insulating film 23 to an FPC connection terminal 27 formed on the insulating film 23.

The lead-out wires 22 and lead wires 29 are configured using a conductive film made from a gate metal, for example, and are formed from the same film as the gate wire. On the other hand, the input connection terminals 21, the output connection terminals 25, and the FPC connection terminals 27 are configured using a laminate of a conductive film and a transparent conductive film made from the source metal, and are formed from the same film as the source wire and pixel electrode.

Figure 4:
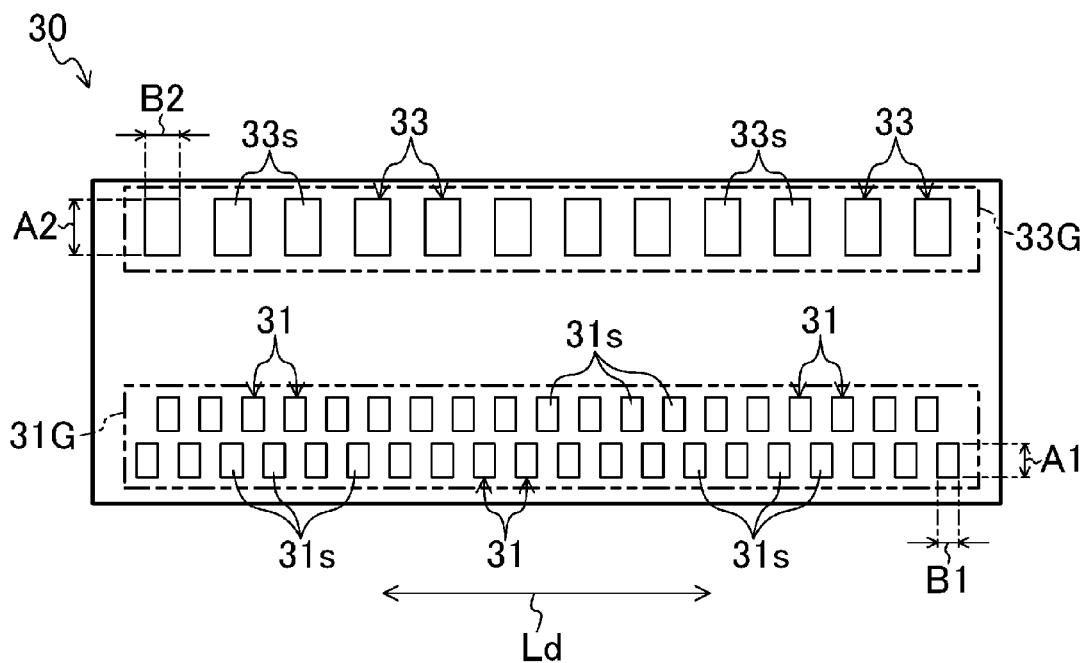
FIG. 4 is a bottom view schematically illustrating an IC chip.

FIG. 4 is a schematic bottom view of the IC chip 30. In FIG. 4, the IC chip 30 is illustrated with the actual number of bumps 31, 33 omitted.

Each IC chip 30 is formed into a rectangle in the plan view as illustrated in FIG. 4. In each IC chip 30, an output bump group 31G, which is a first bump group, is disposed on one of the longer sides (lower side in FIG. 4) of the bottom surface, and an input bump group 33G, which is a second bump group, is disposed on the other of the longer sides (upper side in FIG. 4) of the bottom surface. The output bump group 31G is made by aggregating output bumps 31, which are first bumps. The input bump group 33G is made by aggregating input bumps 33, which are second bumps.

These output bumps 31 and input bumps 33 are formed into a rectangular shape in the plan view, and are made from solder, gold (Au), silver (Ag), copper (Cu), lead (Pd), nickel (Ni), or an alloy thereof, for example.

A plurality of output bumps 31 is arranged in a plurality of rows in a zigzag manner so as to correspond to a group of the input connection terminals 21. That is, the output bumps 31 are aligned in the longer side direction Ld of the IC chip 30, and form a plurality of rows (two rows in the example illustrated in FIG. 4). The plurality of rows formed by the output bumps 31 is arranged separately from one another at a prescribed pitch (half pitch for example) deviation in the longer side direction Ld of the IC chip 30, and in a direction that is orthogonal to the longer side direction Ld of the IC chip 30.

In this plurality of output bumps 31, the pitch arrangement of adjacent output bumps 31 is on average around 14 μm to 16 μm, for example. Furthermore, since this pitch arrangement corresponds to the aforementioned pitch arrangement of the input connection terminals 21, naturally this pitch arrangement may be set even narrower as pitch narrowing advances in line with the enhancement of multi-output capabilities.

A plurality of input bumps 33 is arranged in a row in the longer side direction Ld of the IC chip 30 so as to correspond to a group of the output connection terminals 25. In this plurality of input bumps 33, the pitch arrangement of adjacent input bumps 33 is on average around 60 µm to 120 µm, for example.

In the present embodiment, the area of the end surface 31s of an individual output bump 31 that forms a connection surface with respect to the terminal region 10t is smaller than the area of the end surface 33s that forms the connection surface of an individual input bump 33. Thus, the total area of the end surfaces 31s of the output bumps 31 in the output bump group 31G is larger than the total area of end surfaces 33s of the input bumps 33 in the input bump group 33G.

Specifically, when the height and the width of an individual output bump 31 are represented by A1 and B1, respectively, a total number of output bumps 31 is represented by N1, and a total area of the end surfaces 31s of the output bumps 31 is represented by S1, and the height and width of an individual input bump 33 are represented by A2 and B2, respectively, the total number of input bumps 33 is represented by N2, and the total area of the end surfaces 33s of the input bumps 33 is represented by S2, S1 and S2 can respectively be derived by (Formula 1) and (Formula 2) below. The heights/widths A1, A2, B1, B2 and numbers N1, N2 of both of these bumps 31, 33 are set so as to satisfy (Formula 3) below. As used here, the "end surfaces 31s and 33s" of the output bumps 31 and the input bumps 33 are the surfaces of individual bumps 31 and 33 opposite the terminal region 10t, and signify surfaces that trap conductive particles 37 between the bumps 31 and 33 and the connection terminals 21 and 25.

$$S1 = A1 \times B1 \times N1 \quad \text{(Formula 1)}$$

$$S2 = A2 \times B2 \times N2 \quad \text{(Formula 2)}$$

$$S1 < S2 \quad \text{(Formula 3)}$$

The height A1 of the output bumps 31 is around 70 µm to 120 µm, the width B1 is around 13 µm to 28 µm, and the total number N1 of output bumps 31 is around 1,000, for example. Also, the height A2 of the input bumps 33 is around 60 µm to 120 µm, the width B2 is around 40 µm to 90 µm, and the total number N2 of input bumps 31 is around 300.

These IC chips 30, as illustrated in FIG. 2, are connected to the terminal region 10t via an ACF 34 in accordance with an ACF connection technique that used an ACF 34 containing a large number of conductive particles inside an adhesive (binder) 36 having insulating properties. In accordance with this, the corresponding output bumps 31 and input connection terminals 21, and the corresponding input bumps 33 and output connection terminals 25 are respectively electrically connected by interposing the conductive particles 37 in the ACF 34 therebetween and compressing these conductive particles flat.

The ACF 34 is subjected to bonding by thermocompression, thereby causing conductive particles 37 to be interposed between corresponding output bumps 31 and input connection terminals 21, and between corresponding input bumps 33 and output connection terminals 25 to establish electrical conduction therebetween, and causing an insulating adhesive 36 to be interposed between adjacent input connection terminals 21, output connection terminals 25, output bumps 31 and input bumps 33 to maintain insulation therebetween.

The adhesive 36 includes phenoxy resin, epoxy resin, and a latent curing agent as components, and provides thermosetting properties together with insulating properties, for example. The polymerization ratios of the respective materials are 10 to 80 percent by weight for the phenoxy resin, 5 to 85 percent by weight for the epoxy resin, and 1 to 40 percent by weight for the latent curing agent, for example, and more preferably, 20 to 50 percent by weight for the phenoxy resin, 30 to 70 percent by weight for the epoxy resin, and 5 to 20 percent by weight for the latent curing agent. However, the adhesive 36 is configured such that the total of the percentages by weight of the aforementioned materials becomes 100 percent by weight or less.

A bisphenol A-type phenoxy resin, a bisphenol F-type phenoxy resin, a mixed bisphenol A-type/bisphenol F-type phenoxy resin, a mixed bisphenol A-type/bisphenol S-type phenoxy resin, a fluorene ring-containing phenoxy resin, or a caprolactone modified bisphenol A-type phenoxy resin can be used as the phenoxy resin, for example.

A bisphenol A-type epoxy resin, a bisphenol F-type epoxy resin, a bisphenol S-type epoxy resin, a tetramethyl bisphenol A-type epoxy resin, a biphenol-type epoxy resin, a naphthalene-type epoxy resin, a fluorene-type epoxy resin, a phenolic novolak-type epoxy resin, a cresol novolak-type epoxy resin, a bisphenol A novolak-type epoxy resin, an aliphatic ether-type epoxy resin or other such glycidyl ether-type epoxy resin, a glycidyl ether ester-type epoxy resin, a glycidyl ester-type epoxy resin, a glycidyl amine-type epoxy resin, a hydantoin-type epoxy resin, or an alicyclic epoxide can be used as the epoxy resin, for example. These epoxy resins may undergo halogenation or hydrogenation, or may be modified using urethane, rubber, or silicon.

A curing agent such as a boron compound, hydrazide, tertiary amine, imidazole, dicyandiamide, an inorganic acid, carboxylic acid anhydride, thiol, isocyanate, boron complex salts, or a derivative thereof may be used as the latent curing agent, for example. It is especially preferable that a microcapsule-type curing agent be used as the latent curing agent. A microcapsule-type curing agent is one in which an aforementioned curing agent is placed inside a capsule, and stabilized by covering the microcapsule surface with a resin film or the like. The surface resin film is broken down by temperature and pressure when the IC chip is bonded by thermocompression, and the curing agent disperses outside the microcapsule and reacts with the epoxy resin. Of the microcapsule-type latent curing agents, it is especially preferable that a curing agent that has microencapsulized an adduct-type curing agent, such as an amine adduct or an imidazole adduct, be used due to the outstanding balance between stability and effectiveness of adduct-type curing agents.

Furthermore, it is also possible to add a thermosetting resin other than those mentioned above, a thermoplastic resin, a photocurable resin, or an electron beam curable resin to the adhesive 36 as needed. Phenol resin, silicon resin, urethane resin, acrylic resin, polyimide resin, phenoxy resin, polyvinyl butyral resin, SBR, SBS, NBR, polyethersulfone resin, polyetherterephthalate resin, polyphenylene sulfide resin, polyamide resin, polyetheroxide resin, polyacetal resin, polystyrene resin, polyethylene resin, polyisobutylene resin, alkylphenolic resin, stryrene-butadiene resin, carboxyl-modified nitrile resin, polyphenylene ether resin, polycarbonate resin, polyether ketone resin, or the modified resins thereof can be cited as examples thereof.

The conductive particles 37 are such that either a metal or a metallic oxide was coated onto the surface of a particle, which is the core, and nickel (Ni)-gold (Au) plating was performed (Au plating was performed after forming a Ni layer on the undercoating), for example. From the standpoints of handling and low-temperature plating, the average particle diameter of the core particle is preferably in the range of 0.5 μm to 10 μm. When the particle diameter is smaller than 0.5 μm, the core particles become susceptible to clumping, and handling is difficult. On the other hand, when the particle diameter exceeds 10 μm, low temperature plating is difficult when plating the core particles.

It is also preferable that the thickness of the metal or metallic oxide film plated onto the core particle be in the range of 50 nm to 300 nm from the standpoints of facilitating uniform film formation and bringing the characteristics of the conductive particles 37 themselves into full play. From a manufacturing standpoint, it is difficult to form a uniform film when the film thickness is less than 50 nm. On the other hand, when the film thickness exceeds 300 nm, it is not possible to bring the characteristics of the conductive particles 37 themselves into full play.

Figure 5:
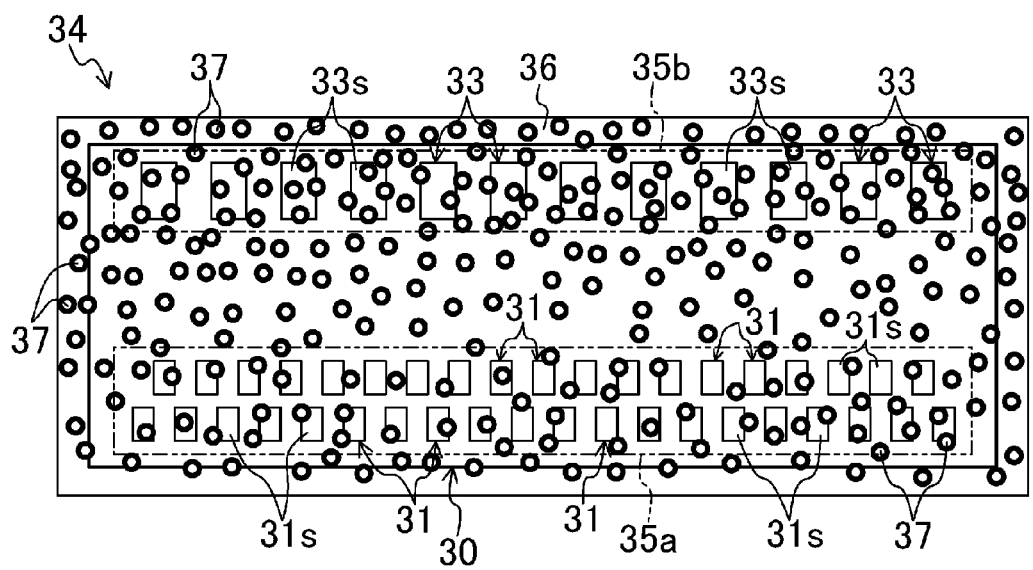
FIG. 5 is a plan view illustrating the distribution of conductive particles within an ACF in conjunction with the bottom surface of an IC chip.
Figure 6:
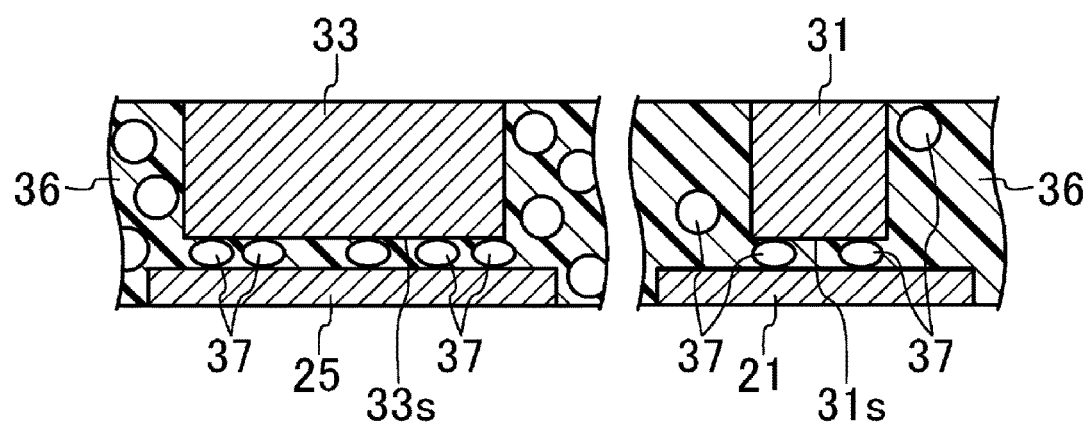
FIG. 6 is an expanded cross-sectional view illustrating the respective connection locations of an input bump and an output bump of the IC chip in a liquid crystal display device according to Embodiment 1.
Figure 14:
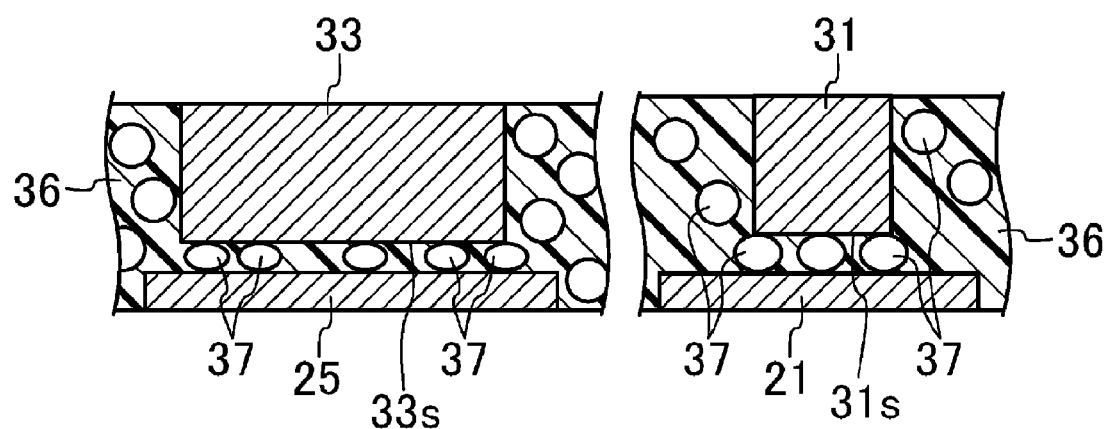
FIG. 14 is an enlarged cross-sectional view illustrating the respective connection locations of an input bump and an output bump of an IC chip in a liquid crystal display device of a conventional configuration.

FIG. 5 is a plan view illustrating the distribution of conductive particles 37 inside an ACF 34 in conjunction with the bottom surface of the IC chip 30. FIG. 6 is an expanded cross-sectional view illustrating the respective connection locations of an input bump 33 and an output bump 31. FIG. 14 is an enlarged cross-sectional view illustrating the respective connection locations of an input bump 33 and an output bump 31 of an IC chip 30 in a liquid crystal display device of a conventional configuration. Furthermore, as a matter of convenience, the conventional configuration illustrated in FIG. 14 will be described by assigning the same reference characters to locations in the configuration that are the same as those in the present embodiment.

The ACF 34 of the present embodiment, as illustrated in FIG. 5, is formed using a single sheet in which the concentration of conductive particles 37 differs in the region corresponding to the input bump group 33G and the region corresponding to the output bump group 31G. In the ACF 34, the concentration of conductive particles 37 in the region 35a corresponding to the output bump group 31G is lower than the concentration of conductive particles 37 in the region 35b corresponding to the input bump group 33G. This makes it possible to ensure a good conduction state between the IC chip 30 and the liquid crystal display panel 10 using a configuration capable of supporting ultra-high-density packaging.

That is, in the present embodiment, since the total area of the end surfaces 31s and 31s of the output bumps 31 forming the output bump group 31G is larger than the total area 33s of the second bumps 33 forming the input bump group 33G, when the IC chip 30 is bonded by pressure to the terminal region 10t, overall more conductive particles 37 are likely to be trapped between the connection terminals 21 of the output bump group 31G than the connection terminals 25 of the input bump group 33G, but since the concentration of conductive particles 37 in the portion 35a corresponding to the output bump group 31G is lower than the concentration of conductive particles 37 in the portion 35b of the ACF 34 corresponding to the input bump group 33G, the difference between the overall number of conductive particles 37 trapped between the output connection terminals 25 in the input bump group 33G and the overall number of conductive particles 37 trapped between the input connection terminals 21 in the output bump group 33G can be reduced. This makes it possible to bring the pressure applied to the trapped conductive particles 37 closer to uniformity at output bump 31 connection locations and input bump 33 connection locations when bonding the IC chip 30 by pressure. As a result, whereas the flatness state of the conductive particles 37 at the connection locations of both of these bumps 31 and 33 has not been uniform and has varied comparatively greatly in a liquid crystal display device of a conventional configuration due to the fact that the total areas of the bump end surfaces 31s and 33s differ for the output bump group 31G and the input bump group 33G as illustrated in FIG. 14, in the present embodiment, as illustrated in FIG. 6, the flatness state of the conductive particles 37 can be made uniform or substantially equal thereto at the connection locations of both the output bumps 31 and the input bumps 33. Moreover, since the configuration of the present embodiment does not place limits on the configurations of the bumps 31 and 33 of the IC chip 30, the enhancement of IC chip multi-output is not impeded.

When the concentration of conductive particles 37 in the ACF 34, more specifically, when the total area of the end surfaces 31s of the output bumps 31 in the output bump group 31G is represented by S1, and the total area of the end surfaces 33s of the input bumps 33 in the input bump group 33G is represented by S2, and when, in the ACF 34, the concentration of the conductive particles 37 in the portion 35a corresponding to the output bump group 31G is represented by D1, and the concentration of the conductive particles 37 in the portion 35b corresponding to the input bump group 33G is represented by D2, the D1 and D2 are set so as to satisfy the following relational formula (Formula 4).

$$D1 \times 0.7 \leq D2 \times (S2/S1) \leq D1 \qquad \text{(Formula 4)}$$

Ideally, D1 and D2 are set so as to satisfy the relational formula $D2 \times (S2/S1) = D1$.

Thus, the percentages by content D1, D2 of conductive particles 37 in the portions 35a and 35b of the ACF 34 corresponding to the bump groups 31G and 33G are set in accordance with the ratio of the total area S1 of the end surfaces 31s of the output bumps 31 in the output bump group 31G to the total area S2 of the end surfaces 33s of the input bumps 33 in the input bump group 33G.

Hypothetically, when the D1 and D2 are set so as to satisfy the relational formula $D1 \times 0.7 > D2 \times (S2/S1)$ here, the concentration of the conductive particles 37 in the portion 35a corresponding to the output bump group 31G of the ACF 34 becomes too high, and there is the danger of short circuits occurring via the conductive particles 37 between either adjacent output bumps 31 or adjacent input connection terminals 21.

On the other hand, when the D1 and D2 are set so as to satisfy the relational formula $D1 \times (S2/S1) > D1$, the concentration of the conductive particles 37 in the portion 35a corresponding to the output bump group 31G of the ACF 34 becomes too low, and there is a danger of either an insufficient number of conductive particles or no conductive particles at all being trapped between the terminal region 21 and the output bumps 31, making it impossible to ensure the desired conduction state between the input connection terminals 21 and these output bumps 31.

By contrast, in the present embodiment, since the D1 and D2 are set so as to satisfy the relational formula $D1 \times 0.7 \leq D2 \times (S2/S1) \leq D1$, a sufficient number of conductive particles 37 can be trapped between the output bumps 31 and the input connection terminals 21 while preventing short circuits from occurring between adjacent output bumps 31 and between adjacent input connection terminals 21, and the desired conduction state can be ensured between these output bumps 31 and input connection terminals 21.

The FPC 40 is also connected to the end portion of the terminal region 10t via an ACF 44 as illustrated in FIG. 2.

In the ACF 44 used to connect the FPC 40, a large number of conductive particles 47 is uniformly distributed inside an insulating adhesive 46. A conduction state with an FPC connection terminal 27 is ensured by interposing the conductive particles 47 in the ACF 44 between the FPC connection terminal 27 in the terminal region 10t and a panel connection terminal 41 formed at the one end of the FPC 40.

Although not shown in the drawing, in the FPC 40, a plurality of copper foil or other such wires connected to the panel connection terminal 41 and/or other connection terminals is disposed on the surface of a base material made from polyimide or the like, and the portions of these wires excluding the connection terminals are formed by being covered by a coverlay made from polyimide or the like.

The FPC 40 is made such that a portion on the opposite side from the portion that connects with the terminal region 10t extends outwardly from the liquid crystal display panel 10 and is connected to a controller (not shown in the drawing), and a display signal that includes image data corresponding to an image to be displayed is inputted from the controller to the liquid crystal display panel 10.

The liquid crystal display device S of the configuration described hereinabove is configured so as, based on a display signal inputted from the controller via the FPC 40, to adjust transmittance when light emitted from a backlight unit passes through the liquid crystal display panel 10, and to display a desired image, for example, in accordance with each IC chip 30 selectively applying a prescribed voltage for each pixel to a liquid crystal layer 17 and controlling an alignment state of liquid crystal molecules in the liquid crystal layer 17 in accordance with the size of the voltage.

—Method of Manufacturing a Liquid Crystal Display Device—

Next, a method of manufacturing the liquid crystal display device S will be described using an example.

In manufacturing the liquid crystal display device S, after respectively manufacturing the active matrix substrate 11 and the opposite substrate 13 and using a printing method or the like to form an alignment layer on the surface of both of these substrates 11 and 13, the liquid crystal panel 10 is manufactured by bonding the substrates 11 and 13 together and sealing the liquid crystal layer 17 between the two substrates 11 and 13 via the sealing material 15. Polarizing plates are then respectively attached to the two outer side surfaces of the liquid crystal display panel 10, and thereafter, the liquid crystal display device S is completed by mounting the IC chips 30 and connecting the FPC 40 to the terminal region 10t.

Figure 7:
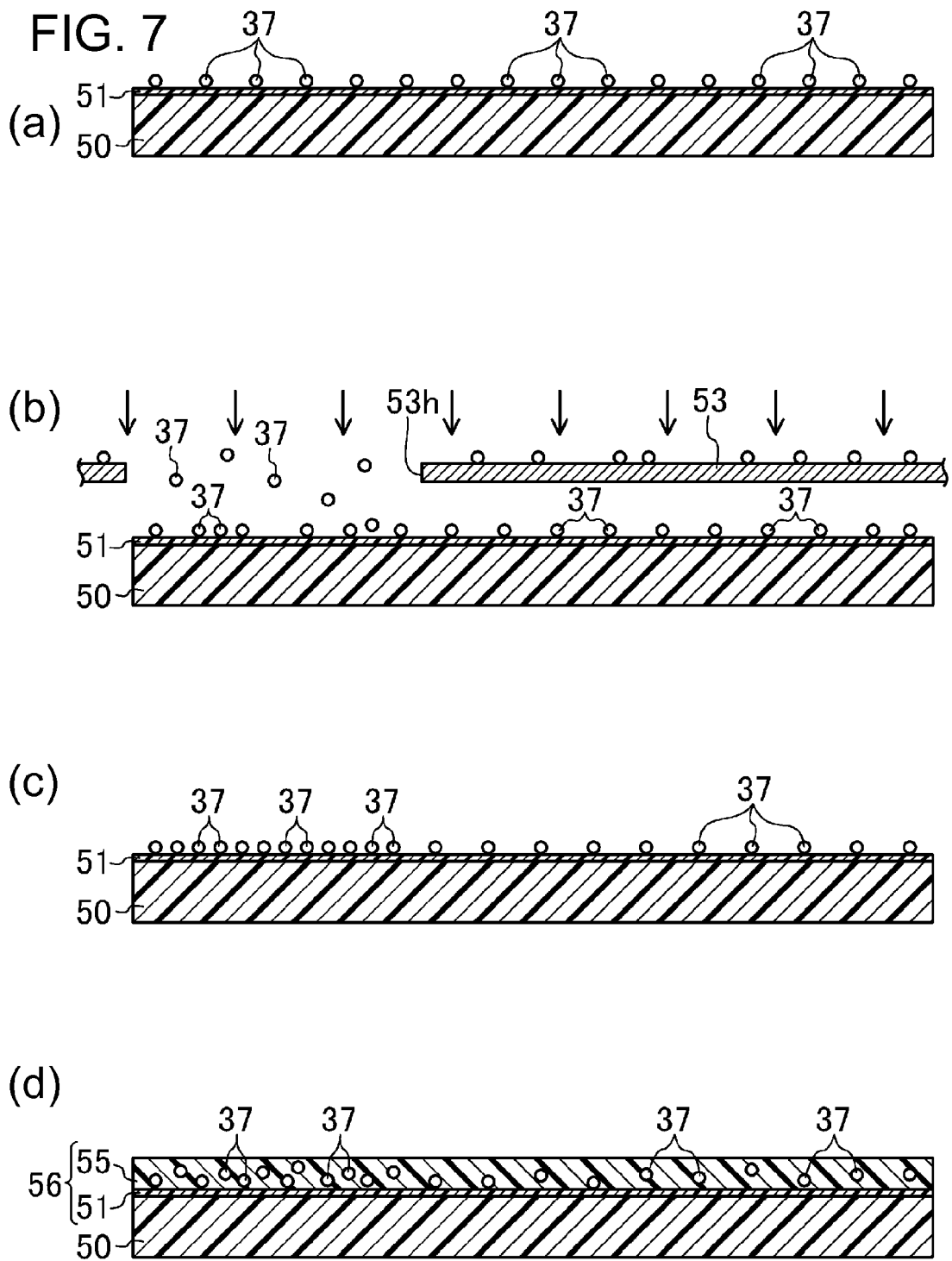
FIGS. 7(a) to 7(d) are cross-sectional views illustrating steps for manufacturing an ACF according to Embodiment 1.

The liquid crystal display device S according to the present invention is characterized by the configuration of the ACF 34 and the mounting structure of the IC chips 30 used therein, and as such the ACF 34 manufacturing method and the IC chip 30 mounting method will be described in detail below while referring to FIGS. 7 and 8.

<ACF 34 Manufacturing Method>

FIGS. 7(a) to 7(d) are cross-sectional views illustrating a method of manufacturing the ACF 34 according to the present embodiment.

First, the adhesive 36 materials are mixed together in an organic solvent to prepare a coating solution. When a filler material or the like is added to the ACF 34 in addition to the aforementioned materials at this time, this additive is also mixed into the organic solvent.

Next, the prepared coating solution is thinly applied onto a base material 50 prepared in advance using an applicator coating to form a coating film 51 that has adhesiveness. Next, the conductive particles 37 are dispersed in a spraying manner onto the coating film 51 using a spray or the like so as to be uniformly dispersed as illustrated in FIG. 7(a).

Conductive particles 37 are also dispersed onto the conductive particle 37-dispersed coating film 51 only in a portion scheduled to correspond to the input bump group 33G. A mask 53 having an opening 53h in a specific location is used in the second dispersion of the conductive particles 37. The mask 53 is formed so that the opening 53h is positioned over the portion (left side portion in FIG. 7(b)) scheduled to correspond to the input bump group 33G of the coating film 51 when arranged in a prescribed location opposite the coating film 51.

When the conductive particles 37 are dispersed the second time, after arranging the mask 53 in a prescribed location opposite the coating film 51, the conductive particles 37 are dispersed in a spraying manner using a spray or the like from the side of the mask 53 opposite the coating film 51 as illustrated in FIG. 7(b). The arrows in FIG. 7(b) illustrate the spraying direction of the conductive particles 37. Then, as illustrated in FIG. 7(c), a larger number of conductive particles 37 is dispersed on the other portion (the portion of the coating film 51 scheduled to correspond to the output bump group 31G) than on the portion of the coating film 51 scheduled to correspond to the input bump group 33G.

The coating solution is also applied, while adjusting the thickness, on top of the coating film 51 onto which the conductive particles 37 have been dispersed two times, and the dispersed conductive particles 37 are buried inside this coating film 55. Next, the solvent of the coating film 55 is removed using an oven to form an ACF matrix 56.

At this time, the ACF matrix 56 may be formed on a peel-off sheet either in place of the base material 50 or laid on top of the base material 50. A sheet made from polyethylene, polypropylene, polystyrene, a polyester, such as polyethylene terephthalate (PET) and polyethylene naphthlate (PEN), nylon, vinyl chloride, or polyvinyl alcohol can be used as the peel-off sheet. It is preferable that a surface treatment, such as fluoridization, siliconization, or alkydization, be performed on the peel-off sheet.

Next, the ACF matrix 56 is stretched into a film shape by pulling the ACF matrix 56 using a roller while applying heat at around 30° C. or less. Thereafter, the stretched ACF matrix 56 is cut out in a prescribed size, shaped, and divided into a plurality of ACFs 34.

An ACF 34 according to the present embodiment can be prepared in this manner.

<IC Chip Mounting Method>

FIGS. 8(a) and 8(b) are cross-sectional views illustrating a method of mounting an IC chip 30 according to the present embodiment.

First, as illustrated in FIG. 8(a), the ACF 34 is attached in the terminal region 10t spanning the location where a group of input connection terminals 21 has been formed, that is, the location where the output bump group 31G is scheduled to be arranged, and the location where a group of output connection terminals 25 has been formed, that is, the location where the input bump group 33G is scheduled to be arranged (attaching step). At this time, the portion 35a of the ACF 34 in which the concentration of the conductive particles 37 is relatively low is arranged at the location where the group of input connection terminals 21 has been formed, and the portion 35b of the ACF 34 in which the concentration of the conductive particles 37 is relatively high is arranged at the location where the group of output connection terminals 25 has been formed, respectively.

The ACF 34 is then temporarily bonded by pressure to the terminal region 10t of the liquid crystal display panel 10. In this temporary bonding by pressure, pressure is applied to the ACF 34 while performing heating with a heater for a prescribed time at a temperature at which the adhesive 36 is not completely cured, such as a temperature of around 80 to 90° C., for example. Thereafter, when the ACF 34 has a protective sheet, this protective sheet is peeled off.

Next, an IC chip 30 is held by a known pressuring jig, and by positioning the IC chip 30 in an opposing manner over the terminal region 10*t* to which the ACF 34 has been temporarily bonded by pressure and lowering the IC chip 30 to the terminal region 10*t* as illustrated in FIG. 8(*b*), the output bump group 31G is pressed against and bonded by thermocompression to the portion 35*a* of the ACF 34 in which the concentration of the conductive particles 37 is relatively low, and the input bump group 33G is pressed against and bonded by thermocompression to the portion 35*b* of the ACF 34 in which the concentration of the conductive particles 37 is relatively high (pressure bonding step). The arrows in FIG. 8(*b*) illustrate the direction in which pressure is applied to the IC chip 30. In the thermocompression bonding, pressure is applied to the ACF 34 while performing heating with a heater for a prescribed time at a temperature at which the adhesive 36 is completely cured, such as a temperature of around 180 to 200° C., for example. In accordance with this, the output bumps 31 of the output bump group 31G and the input bumps 33 of the input bump group 33G are respectively electrically connected to the input connection terminals 21 and the output connection terminals 25 via the conductive particles 37.

The temporary pressure bonding and thermocompression bonding of the ACF 34 was described as being performed by heating using a heater, but the means for heating the ACF 34 is not limited to a heater, and other known heating means, such as photoirradiation using infrared rays, ultraviolet rays, or a laser can also be used.

An IC chip 30 can be mounted to the terminal region 10*t* of the liquid crystal display panel 10 in this manner.

Effects of Embodiment 1

According to Embodiment 1, in the IC chip 30, the total area of the end surfaces 31*s* of the first bumps 31 forming the output bump group 31G is larger than the total area of the end surfaces 33*s* of the second bumps 33 forming the input bump group 33G, but since the concentration of the conductive particles 37 in the portion 35*a* of the ACF 34 corresponding to the output bump group 31G is lower than the concentration of the conductive particles 37 in the portion 35*b* of the ACF 34 corresponding to the input bump group 33G, a good conduction state can be ensured between the IC chip 30 and the liquid crystal display panel 10 using a configuration capable of supporting ultra-high-density packaging.

Moreover, since the percentages by content D1, D2 of the conductive particles 37 in the portions 35*a*, 35*b* of the ACF 34 corresponding to both bump groups 31G, 33G are set in accordance with the ratio of the total area S1 of the end surfaces 31*s* of the output bumps 31 to the total area S2 of the end surfaces 33*s* of the input bumps 33 so as to satisfy the relational formula $D1 \times 0.7 \leq D2 \times (S2/S1) \leq D1$, a sufficient number of conductive particles 37 can be trapped between the output bumps 31 and the input connection terminals 21 while preventing short circuits from occurring between adjacent output bumps 31 and between adjacent input connection terminals 21, and the desired conduction state can be ensured between these output bumps 31 and input connection terminals 21.

Modification Example 1 of Embodiment 1

FIGS. 9(*a*) to 9(*c*) are cross-sectional views illustrating a method of preparing an ACF 34 according to Modification Example 1.

In Embodiment 1, a method of preparing the ACF 34 by dispersing the conductive particles 37 two times using a mask 53 having an opening 53*h* in a specific location was described, but the present modification example uses a method of preparing the ACF 34 with a single dispersion of the conductive particles 37 using a mask 60 with a configuration that differs therefrom.

Specifically, first a coating solution is prepared in the same manner as in Embodiment 1, and the coating solution is thinly applied onto a base material 50 prepared in advance using an applicator coating to form a coating film 51 that has adhesiveness. Next, the conductive particles 37 are dispersed onto the base material on which the coating film 51 has been formed in relatively large numbers in the portion scheduled to correspond to the input bump group 33G and in relatively small numbers in the portion scheduled to correspond to the output bump group 31G as illustrated in FIG. 9(*a*).

In this dispersion of the conductive particles 37, a mask 60 in which a large number of holes 60*h* has been formed in specific locations is used. In this mask 60, when arranging the mask 60 in a prescribed location opposite the coating film 51, holes 60*h* are formed at a relatively high density in the location positioned over the portion scheduled to correspond to the input bump group 33G in the coating film 51, and holes 60*h* are formed at a relatively low density in the location positioned over the portion scheduled to correspond to the output bump group 31G in the coating film 51, respectively. In the mask 60 of the present embodiment, holes 60*h* are not formed between the location positioned over the portion scheduled to correspond to the input bump group 33G and the location positioned over the portion scheduled to correspond to the output bump group 31G at the aforementioned prescribed location.

When dispersing the conductive particles 37, after arranging the mask 60 in the prescribed location opposite the coating film 51, the conductive particles 37 are dispersed in a spraying manner using a spray or the like from the side of the mask 60 opposite the coating film 51 as illustrated in FIG. 9(*a*). The arrows in FIG. 9(*a*) illustrate the spraying direction of the conductive particles 37. In so doing, as illustrated in FIG. 9(*b*), a larger number of conductive particles 37 is dispersed on the portion scheduled to correspond to the input bump group 33G on the coating film 51 than on the portion scheduled to correspond to the output bump group 31G, and the number of conductive particles 37 is made relatively smaller on the portion scheduled to correspond to the output bump group 31G.

As illustrated in FIG. 9(*c*), the coating solution is then applied once again to the conductive particles 37-dispersed coating film 51, and the solvent of the coating film 55 is subsequently removed using an oven to form the ACF matrix 56. Thereafter, a plurality of ACFs 34 can be prepared by stretching the ACF matrix 56 into a film shape in the same manner as in Embodiment 1 and cutting out the stretched ACF matrix 56 in a prescribed size.

Effects of Modification Example 1 of Embodiment 1

According to Modification Example 1, since the conductive particles 37 only need to be dispersed one time in the preparation of the ACF 34, the number of steps required to prepare the ACF 34 can be curbed, ACF 34 preparation efficiency can be improved, and costs can be lowered.

Modification Example 2 of Embodiment 1

FIGS. 10(a) to 10(c) are cross-sectional views illustrating a method of preparing an ACF 34 according to Modification Example 2.

Modification Example 1 described a mask 60 in which holes 60h are not formed between the location positioned over the portion scheduled to correspond to the input bump group 33G and the location positioned over the portion scheduled to correspond to the output bump group 31G at a prescribed location, but in the present modification example, the dispersion of the conductive particles 37 is performed using a mask 70 in which holes 70h have also been formed in the portion in question as illustrated in FIG. 10(a).

Specifically, in this mask 70, when arranging the mask 70 in a prescribed location opposite the coating film 51, a large number of holes 70h is formed such that the distribution density becomes gradually lower from the location positioned over the portion scheduled to correspond to the input bump group 33G in the coating film 51 toward the location positioned over the portion scheduled to correspond to the output bump group 31G in the coating film 51.

When dispersing the conductive particles 37, after arranging the mask 70 in the prescribed location, the conductive particles 37 are dispersed in a spraying manner using a spray or the like from the side of the mask 70 opposite the coating film 51 as illustrated in FIG. 10(a). The arrows in FIG. 10(a) illustrate the spraying direction of the conductive particles 37. In so doing, as illustrated in FIG. 10(b), a larger number of conductive particles 37 is dispersed on the portion scheduled to correspond to the input bump group 33G on the coating film 51 than on the portion scheduled to correspond to the output bump group 31G, and the number of conductive particles 37 is made relatively smaller on the portion scheduled to correspond to the output bump group 31G.

Then, as illustrated in FIG. 10(c), the coating solution is applied once again to the coating particle 37-dispersed coating film 51, and the solvent of the coating film 55 is subsequently removed using an oven to form the ACF matrix 56. Thereafter, a plurality of ACFs 34 can be prepared by stretching the ACF matrix 56 into a film shape in the same manner as in Embodiment 1 and cutting out the stretched ACF matrix 56 in a prescribed size.

Effects of Modification Example 2 of Embodiment 1

When using an ACF 34 prepared by the method in Modification Example 2, the bumps 31 and 33 can be electrically connected to the connection terminals 21 and 25 via the conductive particles 37 even in a configuration in which the IC chip 30 is provided with either input bumps 33 or output bumps 31 aligned not only along the longer sides of the bottom surface but also along the shorter sides of the bottom surface. Therefore, the ACF 34 of the present modification example can also be suitably used to mount an IC chip 30 on which the bumps 31, 33 have been disposed on the shorter sides of the bottom surface.

Embodiment 2 of the Invention

Figure 11:
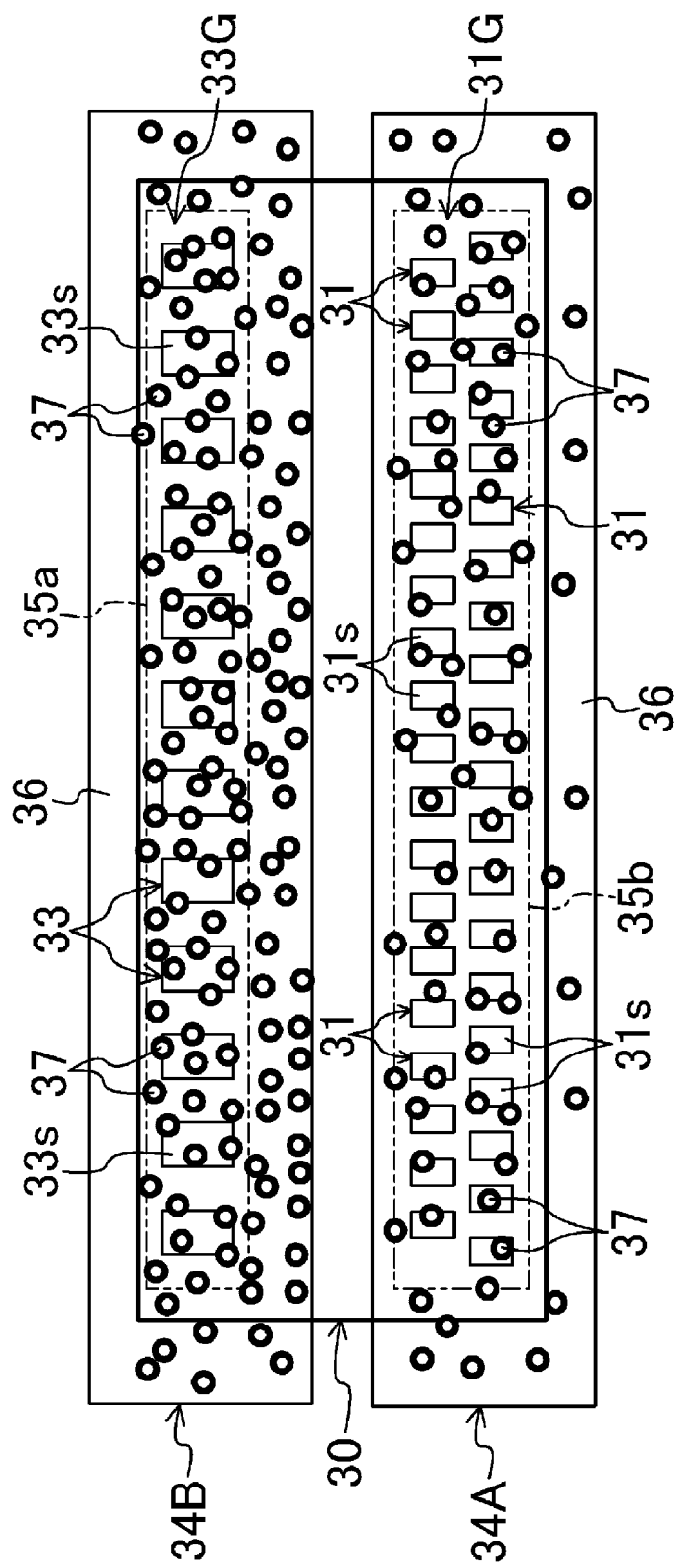
FIG. 11 is a plan view of ACFs in conjunction with the bottom surface of an IC chip according to Embodiment 2.

FIG. 11 is a plan view of ACFs 34A and 34B in conjunction with the bottom surface of an IC chip 30 according to Embodiment 2. Furthermore, the embodiments hereinbelow are the same as Embodiment 1 except when the configuration of the ACF 34 and the method of mounting the IC chip 30 using the ACF 34 differ from Embodiment 1, and therefore only the portions that differ from Embodiment 1 will be described; the explanation will defer to that of Embodiment 1 based on FIGS. 1 to 8 for parts having the same configuration, and detailed descriptions thereof will be omitted.

In Embodiment 1, the ACF 34 was described as being formed from a single sheet in which the concentration of the conductive particles 37 differed between the region 35a corresponding to the output bump group 31G and the region 35b corresponding to the input bump group 33G, but in the present embodiment, ACFs 34A and 34B are formed using separate sheets with different percentages by content of the conductive particles 37 in the region 35a corresponding to the output bump group 31G and the region 35b corresponding to the input bump group 33G.

Specifically, in the terminal region 10t, a low-density ACF 34A in which the concentration of the conductive particles 37 is relatively low is arranged in the location corresponding to the output bump group 31G, and a high-density ACF 34B in which the concentration of the conductive particles 37 is relatively high is arranged in the location corresponding to the input bump group 33G, respectively. Regarding the concentration of the conductive particles 37 in these ACFs 34A, 34B, when the concentration of the conductive particles 37 in the low-density ACF 34A is represented by D1, and the concentration of the conductive particles 37 in the high-density ACF 34B is represented by D2, the D1 and D2 are set so as to satisfy the aforementioned (Formula 4).

FIGS. 12(a) and 12(b) are cross-sectional views illustrating a method of mounting an IC chip 30 according to the present embodiment.

In mounting an IC chip 30 to the terminal region 10t of the liquid crystal display panel 10 using the ACFs 34A and 34B, first the low-density ACF 34A is attached at the location where a group of input connection terminals 21 has been formed in the terminal region 10t, and the high-density ACF 34B is attached at the location where a group of output connection terminals 25 has been formed in the terminal region 10t, respectively (attaching step). The low-density ACF 34A and the high-density ACF 34B may be attached separately at this time, but it is preferable that the ACFs 34A and 34B be attached simultaneously from the standpoint of reducing the number of steps required to mount the IC chip 30. Then, in the same manner as Embodiment 1, both ACFs 34A and 34B are temporarily bonded by pressure to the terminal region 10t, and protective sheets are peeled off as necessary.

Next, an IC chip 30 is positioned in an opposing manner over the terminal region 10t to which the ACFs 34A, 34B have been temporarily bonded by pressure, the output bump group 31G is pressed against and bonded by thermocompression to the low-density ACF 34A, and the input bump group 33G is pressed against and bonded by thermocompression to the high-density ACF 34B, respectively (pressure bonding step). In accordance with this, the IC chip 30 is mounted to the liquid crystal display panel 10.

Effects of Embodiment 2

According to Embodiment 2, since ordinary ACFs in which the distribution of the conductive particles 37 is uniform can be used as the low-density ACF 34A and the high-density ACF 34B, the liquid crystal display device S can be manufactured at lower cost by not requiring an expensive ACF that has a special configuration, such as percentages by content of the conductive particles 37 that differ in a partial manner. Additionally, the same effects as Embodiment 1 can be obtained.

Embodiment 3 of the Invention

Figure 13:
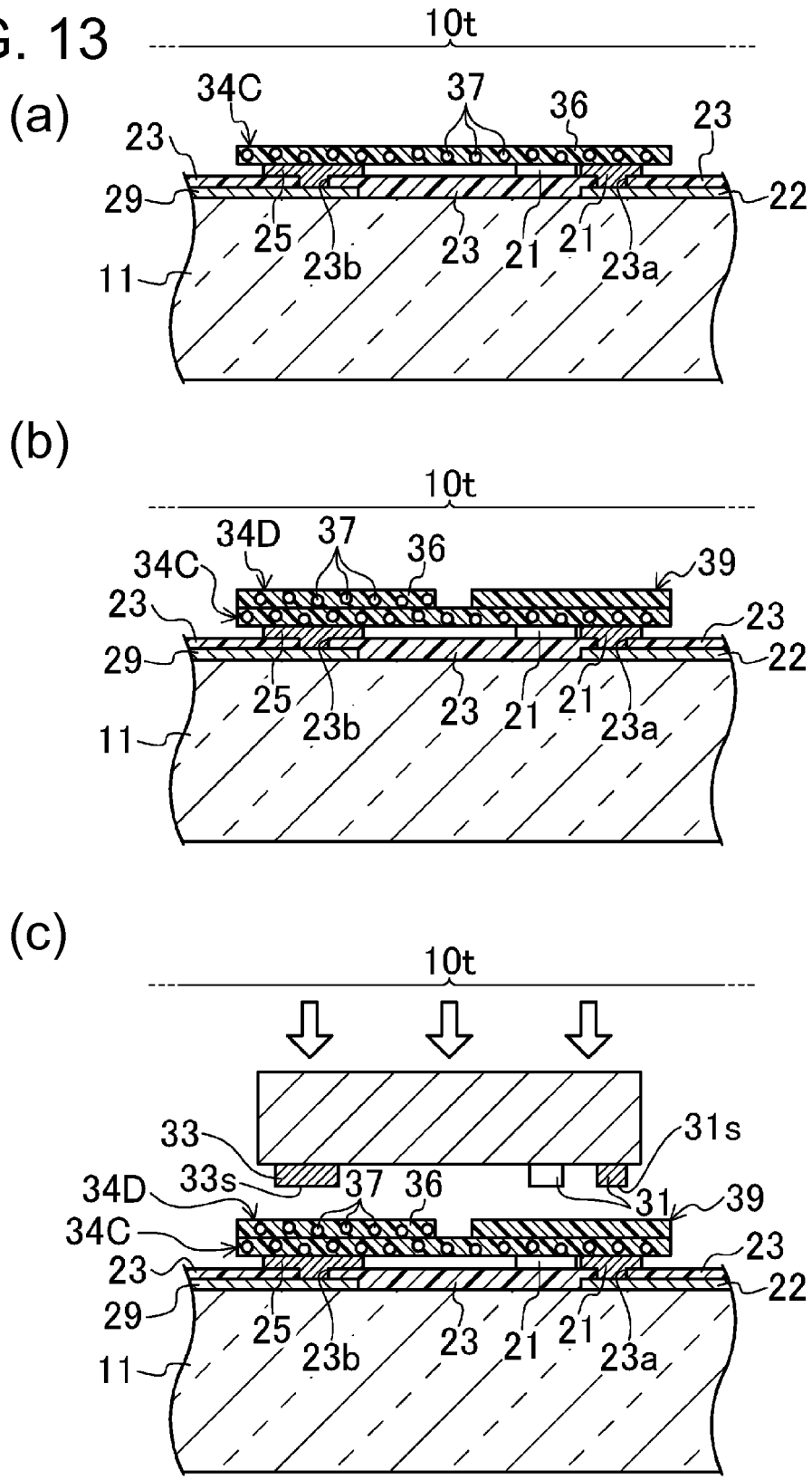
FIGS. 13(a) to 13(c) are cross-sectional views illustrating steps for mounting an ACF according to an Embodiment 3.

FIGS. 13(a) to 13(c) are cross-sectional views illustrating a method of mounting an IC chip 30 according to Embodiment 3.

Embodiment 1 was described such that an IC chip 30 is mounted using a single ACF 34 in which the concentration of the conductive particles 37 has been set to differ in a partial manner, and Embodiment 2 was described such that an IC chip 30 is mounted using two ACFs 34A and 34B having mutually different percentages by content of the conductive particles 37, but the present embodiment employs a method of mounting an IC chip 30 using two ACFs 34C and 34D and one NCF 39.

Specifically, first, a first ACF 34C in which the conductive particles 37 are uniformly distributed is prepared, and, as illustrated in FIG. 13(a), the first ACF 34C is attached spanning the location in which the group of input connection terminals 21 has been formed in the terminal region 10t and the location in which the group of output connection terminals 25 has been formed in the terminal region 10t (first attaching step). The concentration of the conductive particles 37 in this first ACF 34C is not particularly limited so long as a good conduction state can be ensured between the output bumps 31 and the input connection terminals 21, and short circuiting does not occur between these output bumps 31 or between these input connection terminals 21.

Next, as illustrated in FIG. 13(b), a second ACF 34D in which the conductive particles 37 are uniformly distributed is attached in an overlapping manner to the first ACF 34C at the location where the output bump group 31G is scheduled to be arranged, and an NCF 39, which does not include conductive particles 37, is attached in an overlapping manner to the first ACF 34C at the location where the input bump group 33G is scheduled to be arranged (second attaching step). The second ACF 34D and the NCF 39 may be attached separately at this time, but it is preferable that the second ACF 34C and the NCF 39 be attached simultaneously from the standpoint of reducing the number of steps required to mount the IC chip 30. The second ACF 34D and the NCF 39 are then temporarily bonded by pressure, and protective sheets are peeled therefrom as necessary.

Next, as illustrated in FIG. 13(c), the IC chip 30 is positioned in an opposing manner over the terminal region 10t to which the second ACF 34D and the NCF 39 have been attached, and bonded by thermocompression to the terminal region 10t by the output bump group 31G being pressed against the region where the first ACF 34C and the second ACF 34D overlap, and the input bump group 33G being pressed against the region where the first ACF 34C and the NCF 39 overlap (pressure bonding step). In accordance therewith, the output bumps 31 of the output bump group 31G and the input bumps 33 of the input bump group 33G are respectively electrically connected to the input connection terminals 21 and the output connection terminals 25 via the conductive particles 37.

When the IC chip 30 is mounted to the terminal region 10t in this manner, because the output bumps 31 are connected to the terminal region 10t via the two integrated ACFs 34C, 34D, the concentration of the conductive particles 37 in the portion of the ACF 34 corresponding to the output bump group 31G becomes relatively high. On the other hand, because the input bumps 33 are connected to the terminal region 10t via the ACF 34C and the NCF 39, the portion of the ACF 34C corresponding to the input bump group 33G is integrated with the NCF 39, and therefore the concentration of the conductive particles 37 therein becomes relatively low.

Effects of Embodiment 3

According to Embodiment 3, the liquid crystal display device S according to the present invention can be manufactured using a simple method.

Other Embodiments

Embodiment 1 was described such that the percentages by content D1 and D2 of the conductive particles 37 in the portions 35a and 35b of the ACF 34 corresponding to the output bump group 31G and the input bump group 33G are set in accordance with the ratio of the total areas S1 and S2 of the end surfaces 31s and 33s of the output bumps 31 and the input bumps 33 so as to satisfy the relational formula $D1 \times 0.7 \leq D2 \times (S2/S1) \leq D1$, but the present invention is not limited to this. The D1 and D2 do not need to satisfy the relational formula as long as the concentration of the conductive particles 37 in the portion 35a of the ACF 34 corresponding to the output bump group 31G is lower than the concentration of the conductive particles 37 in the portion 35b of the ACF 34 corresponding to the input bump group 33G, and when this condition is satisfied, the size and shape of the individual bumps 31 and 33 do not matter. The same holds true for the percentages by content of the conductive particles 37 in the low-density ACF 34A and the high-density ACF 34B in Embodiment 2.

Embodiment 1 and variations thereof, as well as Embodiment 2 were described giving as an example a case in which the total area of the end surfaces 31s of the output bumps 31 in the output bump group 31G is larger than the total area of the end surfaces 33s of the input bumps 33 in the input bump group 33G, but the present invention is not limited to this. In contrast to this, when the total area of the end surfaces 33s of the input bumps 33 in the input bump group 33G is larger than the total area of the end surfaces 31s of the output bumps 31 in the output bump group 31G, the concentration of the conductive particles 37 in the portion 35b of the ACF 34 corresponding to the input bump group 33G may be lower than the concentration of the conductive particles 37 in the portion 35a of the ACF 34 corresponding to the output bump group 31G.

When the present invention is configured in this manner, a good conduction state can also be ensured between the IC chip 30 and the liquid crystal display panel 10 using a configuration capable of supporting ultra-high-density packaging in the case described above. In this case, the input bumps 33 and the input bump group 33G respectively constitute the first bumps of the present invention and the first bump group of the present invention, and the output bumps 31 and the output bump group 31G respectively constitute the second bumps of the present invention and the second bump group of the present invention.

The preferred embodiments and variations of the present invention have been described above, but the technical scope of the present invention is not limited to the scope of the descriptions in these embodiments and variations. The above embodiments and variations are illustrative, and a person skilled in the art will recognize that various other variations are possible by combining the components and treatment processes thereof, and that such variations also fall within the scope of the present invention.

The above embodiments were described using the example of a liquid crystal display device S, but the present invention is not limited to this, and can also be applied as a matter of course to other display devices, such as an organic electroluminescent (EL) display device and/or a plasma display device, and can be widely applied when the display device has a COG mounting structure.

INDUSTRIAL APPLICABILITY

As described above, the present invention is useful for a display device such as a liquid crystal display device having a COG mounting structure, and more particularly is suitable for a display device in which ensuring a good conduction state between an IC chip and the display panel using a configuration capable of supporting ultra-high-density packaging is desired.

DESCRIPTION OF REFERENCE CHARACTERS

S liquid crystal display device
10 liquid crystal display panel
10t terminal region
21 input connection terminal
25 output connection terminal
30 IC chip (integrated circuit chip)
31 output bump (first bump)
31G output bump group (first bump group)
31s output bump end surface
33 input bump (second bump)
33G input bump group (second bump group)
33s input bump end surface
34 ACF (anisotropic conductive film)
34A ACF (anisotropic conductive film)
34B ACF (anisotropic conductive film)
34C first ACF (first anisotropic conductive film)
34D second ACF (second anisotropic conductive film)
36 adhesive
37 conductive particles
39 NCF (non conductive film)

What is claimed is:
1. A display device, comprising:
a display panel having a display region and a terminal region; and
an integrated circuit chip disposed in said terminal region via an anisotropic conductive film that has a plurality of conductive particles,
wherein said integrated circuit chip has a first bump group in which a plurality of first bumps are aggregated and a second bump group in which a plurality of second bumps are aggregated,
wherein the first bumps of said first bump group and the second bumps of said second bump group are electrically connected to said terminal region via said conductive particles of the anisotropic conductive film,
wherein a total area of end surfaces of the first bumps in said first bump group is larger than a total area of end surfaces of the second bumps in said second bump group,
wherein the concentration of conductive particles in said anisotropic conductive film corresponding to said first bump group is lower than the concentration of conductive particles in said anisotropic conductive film corresponding to said second bump group, and
wherein D1 and D2 satisfy a relational formula below:

$$D1 \times 0.7 \leq D2 \times (S2/S1) \leq D1$$

where D1 is the concentration of conductive particles in said anisotropic conductive film corresponding to said first bump group of the integrated circuit chip, D2 is the concentration of conductive particles in said anisotropic conductive film corresponding to said second bump group of the integrated circuit chip, S1 is the total area of the end surfaces of the first bumps in said first bump group, and S2 is the total area of the end surfaces of the second bumps in said second bump group.

2. The display device according to claim 1, wherein said anisotropic conductive film is formed using a single sheet in which the concentration of said conductive particles differs in a region corresponding to said first bump group of the integrated circuit chip and in a region corresponding to said second bump group of the integrated circuit chip.

3. The display device according to claim 1, wherein said anisotropic conductive film is formed using separate sheets in which the concentration of said conductive particles differs in a region corresponding to said first bump group of the integrated circuit chip and in a region corresponding to said second bump group of the integrated circuit chip.

4. The display device according to claim 1,
wherein said first bumps of the integrated circuit chip are output bumps and are arranged in a plurality of rows in a zigzag manner, and
wherein said second bumps of the integrated circuit chip are input bumps.

5. The display device according to claim 1, wherein an area of the end surface of each of said first bumps of the integrated circuit chip is smaller than an area of the end surface of each of said second bumps of the integrated circuit chip.

6. The display device according to claim 1, wherein said display panel is a liquid crystal display panel.

* * * * *